(12) United States Patent
Kumar et al.

(10) Patent No.: US 6,855,981 B2
(45) Date of Patent: Feb. 15, 2005

(54) SILICON CARBIDE POWER DEVICE HAVING PROTECTIVE DIODE

(75) Inventors: Rajesh Kumar, Kariya (JP); Hiroki Nakamura, Kariya (JP); Tsuyoshi Yamamoto, Kariya (JP); Toshiyuki Morishita, Iwakura (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/230,152

(22) Filed: Aug. 29, 2002

(65) Prior Publication Data

US 2003/0042538 A1 Mar. 6, 2003

(30) Foreign Application Priority Data

Aug. 29, 2001 (JP) ........................................ 2001-259661
Aug. 29, 2001 (JP) ........................................ 2001-259996

(51) Int. Cl.[7] ............................................. H01L 29/76
(52) U.S. Cl. ....................... 257/328; 257/135; 257/287; 257/355
(58) Field of Search ................................. 257/134–135, 257/287, 328, 355

(56) References Cited

U.S. PATENT DOCUMENTS

| | | | | | |
|---|---|---|---|---|---|
| 5,396,085 | A | * | 3/1995 | Baliga ........................... | 257/77 |
| 5,475,258 | A | | 12/1995 | Kato et al. .................... | 257/603 |
| 5,969,378 | A | * | 10/1999 | Singh ............................ | 257/77 |
| 6,204,715 | B1 | * | 3/2001 | Sellnau et al. ............... | 327/309 |
| 6,239,958 | B1 | * | 5/2001 | Kato et al. .................... | 361/56 |
| 6,268,242 | B1 | * | 7/2001 | Williams et al. ............. | 438/237 |
| 6,373,318 | B1 | * | 4/2002 | Dohnke et al. .............. | 327/427 |
| 6,535,050 | B2 | * | 3/2003 | Baudelot et al. ............. | 327/430 |
| 6,614,281 | B1 | * | 9/2003 | Baudelot et al. ............. | 327/321 |

FOREIGN PATENT DOCUMENTS

| | | |
|---|---|---|
| JP | A-3-8373 | 1/1991 |
| JP | A-11-266015 | 9/1999 |
| JP | A-2000-312008 | 11/2000 |

OTHER PUBLICATIONS

Theobald et al., "An Ignition IGBT with Smart Functions in Chip on Chip Technology," *Proceedings of 2001 ISPSD*, 9.33, pp. 303–306. 2001.

* cited by examiner

*Primary Examiner*—Allan R. Wilson
(74) *Attorney, Agent, or Firm*—Posz & Bethards, PLC

(57) ABSTRACT

A silicon carbide power device includes a junction field effect transistor and a protective diode, which is a Zener or PN junction diode. The PN junction of the protective diode has a breakdown voltage lower than the PN junction of the transistor. Another silicon carbide power device includes a protective diode, which is a Schottky diode. The Schottky diode has a breakdown voltage lower than the PN junction of the transistor by adjusting Schottky barrier height or the depletion layer formed in the semiconductor included in the Schottky diode. Another silicon carbide power device includes three protective diodes, which are Zener diodes. Two of the protective diodes are used to clamp the voltages applied to the gate and the drain of the transistor due to surge energy and used to release the surge energy. The last diode is a thermo-sensitive diode, with which the temperature of the JFET is measured.

20 Claims, 30 Drawing Sheets

US 6,855,981 B2

SILICON CARBIDE POWER DEVICE HAVING PROTECTIVE DIODE

CROSS REFERENCE TO RELATED APPLICATION

This application is based on and incorporates herein by reference Japanese Patent Applications No. 2001-259661 filed on Aug. 29, 2001 and No. 2001-259996 filed on Aug. 29, 2001.

BACKGROUND OF THE INVENTION

The present invention relates to a silicon carbide power device having a protective diode and the method for manufacturing the power device.

A silicon carbide power device including a junction field effect transistor (JFET) is proposed in JP-A-2000-312008. However, when the proposed device is used as a switching device such as an inverter for controlling a motor, there is the following problem in the proposed device. The proposed device is relatively readily destroyed by static electricity generated in the manufacturing process, by overheat due to an excessive current caused when the motor is locked, or by surge energy due to counter electromotive force generated when the inverter controls the motor. In addition, the proposed device includes a gate and a channel, and the gate is not insulated from the channel region by an oxide film as is in a MOSFET. Therefore, if an avalanche breakdown is caused at a PN junction in the proposed device, the current generated by the avalanche breakdown flows from the gate into a circuit that controls the gate to destroy the circuit.

SUMMARY OF THE INVENTION

The present invention has been made in view of the above aspects with an object to provide a silicon carbide power device protected from static electricity, overheat, and surge energy, and to a method for manufacturing the device.

In the present invention, a silicon carbide power device includes a protective diode, which is a Zener or PN junction diode, in addition to a JFET to prevent the JFET from being destroyed and to protect a circuit that controls a gate of the JFET. Each of the JFET and the protective diode includes a PN junction formed with layers that are substantially made of silicon carbide. The PN junction of the protective diode has a breakdown voltage lower than the PN junction of the JFET to protect the JFET.

In the present invention, another silicon carbide power device includes a protective diode, which is a Schottky diode. The Schottky diode has a breakdown voltage, which is controlled using Schottky barrier height or the depletion layer formed in the semiconductor included in the Schottky diode and is lower than the PN junction of the JFET, to protect the JFET.

In the present invention, other silicon carbide power device includes three protective diodes, which are Zener diodes. Two of the protective diodes are used to clamp the voltages applied to the gate and a drain of the JFET due to surge energy and used to release the surge energy. The last diode is a thermo-sensitive diode, with which the temperature of the JFET is measured. When the temperature is higher than a predetermined one, the JFET is turned off to prevent the JFET from overheating.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The present invention will be described in detail with reference to various embodiments.

First Embodiment

Figure 1:
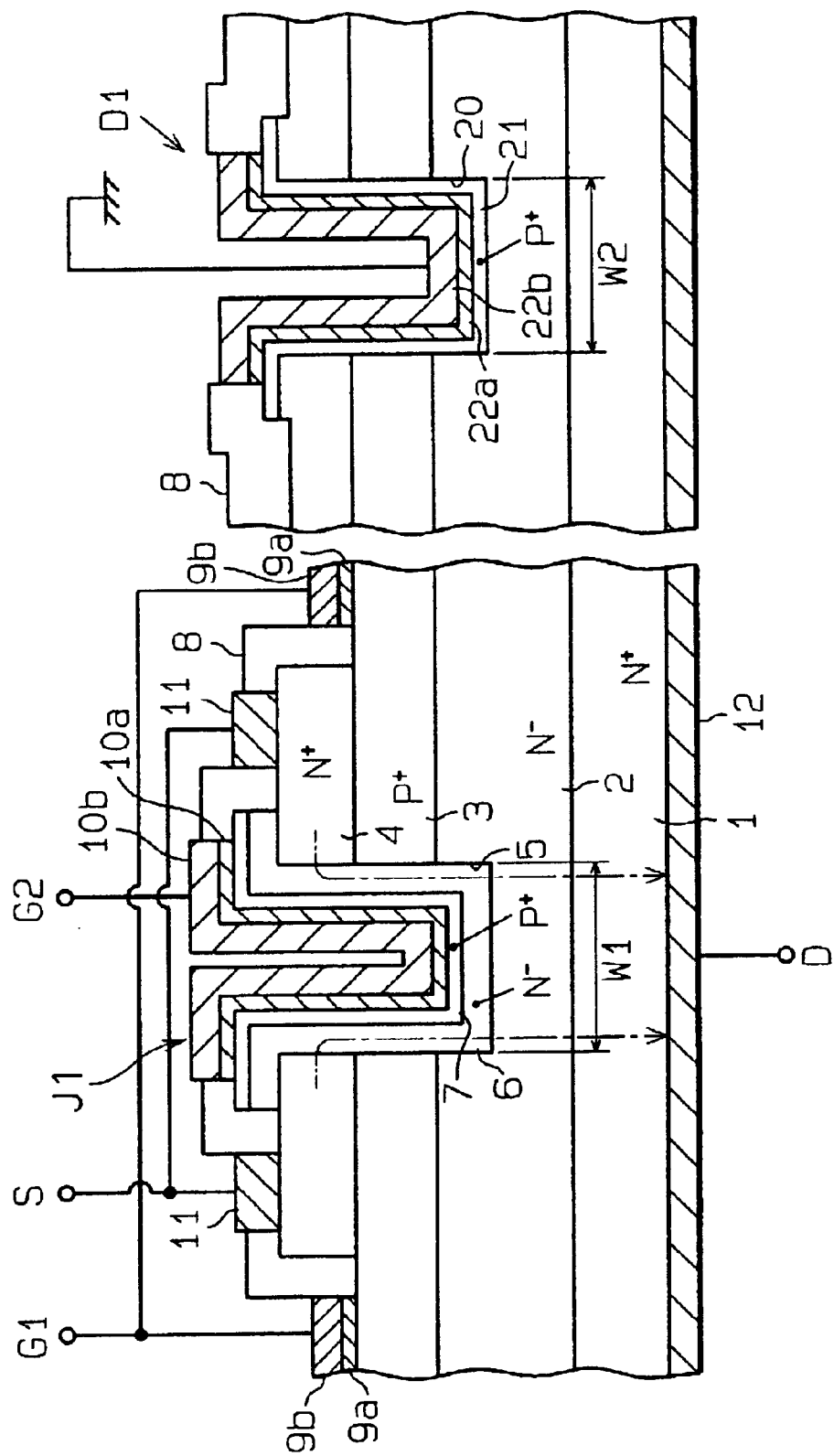
FIG. 1 is a view showing a schematic partial cross-sectional structure and a schematic wiring diagram of a silicon carbide power device according to a first embodiment of the present invention.

As shown in FIG. 1, a silicon carbide power device according to the first embodiment includes a JFET J1 as a silicon carbide power transistor and a protective diode D1, which is a Zener or PN junction diode, as a surge absorber. The silicon carbide power device includes an $n^+$-type substrate 1, which has a first conduction type, an $n^-$-type drift layer 2, which has the first conduction type, a $p^+$-type first gate layer 3 (first JFET impurity layer), which has a second conduction type, and an $n^+$-type source layer 4, which has the first conduction type. The substrate 1 and the layers 2, 3, 4 are substantially made of silicon carbide (SiC). The substrate 1 has a front surface and a back surface, which is opposite from the front surface. The layers 2, 3, 4 are sequentially layered in the above order on the front surface of the substrate 1. The impurity concentration of the $n^-$-type drift layer 2 is lower than those of the $n^+$-type substrate 1 and the $n^+$-type source layer 4.

In the JFET J1, a first trench 5 extends from the upper surface of the $n^+$-type source layer 4 to the $n^-$-type drift layer 2 through the $p^+$-type first gate layer 3. An $n^-$-type channel layer 6 and a $p^+$-type second gate layer 7 (second JFET impurity layer), which are substantially made of SiC, are located in this order on the surface defining the first trench 5. As viewed in FIG. 1, an LTO film 8, which is an insulating film, is located on the $n^+$-type source layer 4.

The LTO film 8 has a plurality of openings. A first gate electrode, which includes an ohmic contact electrode 9a and a wiring electrode 9b, is located on the $p^+$-type first gate layer 3 at each opening. A second gate electrode, which includes an ohmic contact electrode 10a and a wiring electrode 10b, is located on the $p^+$-type second gate layer 7. In the silicon carbide power device in FIG. 1, the ohmic contact electrodes 9a, 10a are substantially made of aluminum, and the wiring electrodes 9b, 10b are substantially made of nickel. However, in the case that the first and second gate electrodes are electrically connected to an n-type layer, the ohmic contact electrodes 9a, 10a are not necessary. A plurality of source electrodes 11 are located on the $n^+$-type source layer 4. A drain electrode 12 is located on the entire back surface of the substrate 1.

The silicon carbide power device in FIG. 1 is a normally-off type, and the drain current of the device is controlled by the width of a channel. The width of the channel is determined by the width of the depletion layer of the channel layer 6 between the first and second gate layers 3, 7. In the silicon carbide power device in FIG. 1, the first and second gate layers 3, 7 make up the gate of the JFET J1.

In the protective diode D1, a second trench 20 extends from the upper surface of the $n^+$-type source layer 4 to the $n^-$-type drift layer 2 through the $p^+$-type first gate layer 3. A $p^+$-type impurity layer 21, which is substantially made of SiC, is located on the surface defining the second trench 20. An electrode, which includes an ohmic contact electrode 22a and a wiring electrode 22b, is located on the $p^+$-type impurity layer 21 and is grounded.

The protective diode D1 accounts for 10 to 50% of the entire area of the silicon carbide power device and has a PN junction. The PN junction of the protective diode D1 has a breakdown voltage lower than the PN junction formed with the $n^-$-type drift layer 2 and the $p^+$-type first gate layer 3 in the JFET J1. As shown in FIG. 1, the $p^+$-type second gate layer 7 in the JFET J1 is closer to the $n^+$-type substrate 1 than the $p^+$-type first gate layer 3 is, and the $p^+$-type impurity layer 21 of the protective diode D1 is closer to the $n^+$-type substrate 1 than the $p^+$-type second gate layer 7 is. With this structure, the depletion layer extending from the $p^+$-type impurity layer 21 reaches the substrate 1 at a lower voltage than the one at which the $p^+$-type second gate layer 7 does. Once the depletion layer extending from the $p^+$-type impurity layer 21 reaches the substrate 1, the depletion layer does not extend any more. Therefore, an avalanche breakdown is caused at the PN junction of the protective diode D1 at a lower voltage than the one at which an avalanche breakdown is otherwise caused at the PN junction of the JFET J1. In other words, the protective diode D1 permits the JFET J1 to operate in the area of safety operation. Thus, the protective diode D1 prevents the JFET J1 from being destroyed by an excessive energy due to static electricity, surge energy, and so on, and protects the circuit that controls the gate of the JFET J1 even if such excessive current as surge current is generated in the device.

Figure 2:
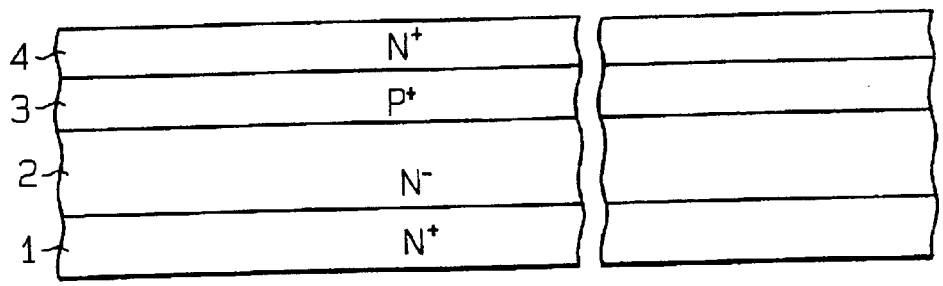
FIGS. 2 to 8 are partial cross-sectional views showing sequential steps of the fabrication process of the silicon carbide power device according to the first embodiment.
Figure 3:
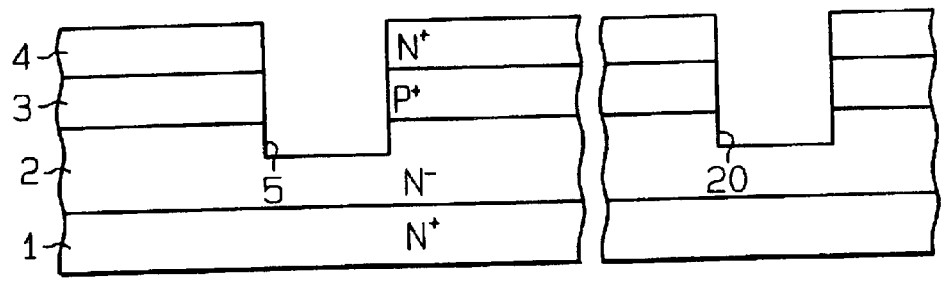

The silicon carbide power device according to the first embodiment is manufactured as follows. Firstly, as shown in FIG. 2, a first epitaxial layer, a second epitaxial layer, and a third epitaxial layer, from which the $n^-$-type drift layer 2, the $p^+$-type first gate layer 3, and the $n^+$-type source layer 4 are respectively formed, are formed in this order on the front surface of the $n^+$-type substrate 1, which is substantially made of SiC (4H-SiC). Then, as shown in FIG. 3, the first and second trenches 5, 20, which extend from the upper surface of the third epitaxial layer to the first epitaxial layer through the second epitaxial layer and have the same depth, are simultaneously formed by reactive ion etching (RIE). The width W1 of the first trench 5 may be equal to or may be different from the width W2 of the second trench 20.

Figure 4:
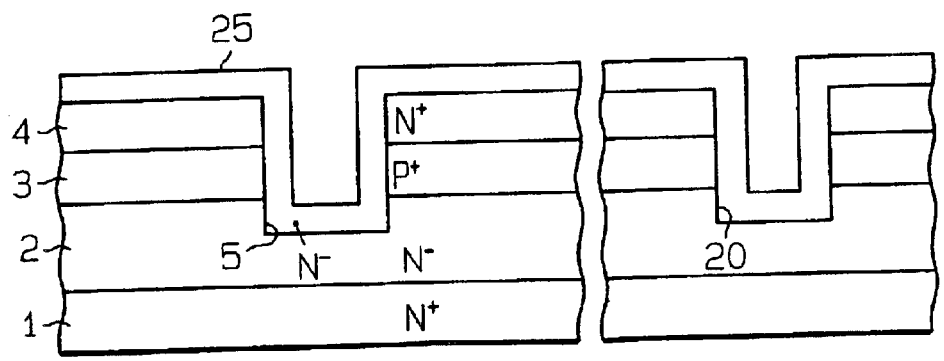
Figure 5:
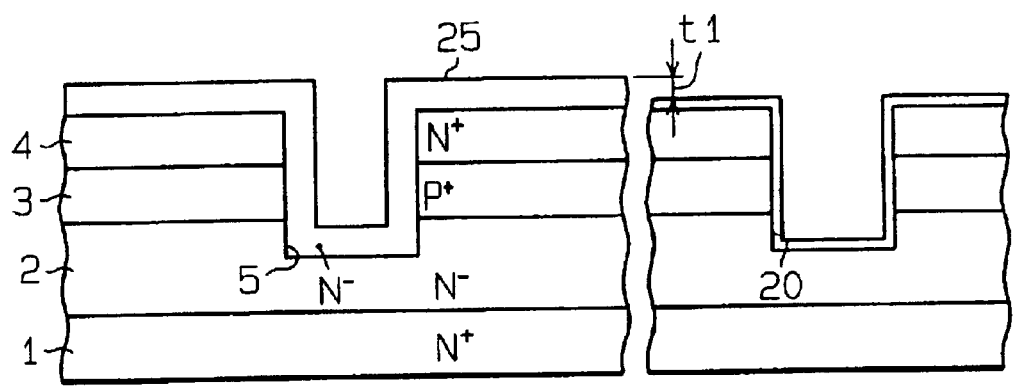
Figure 6:
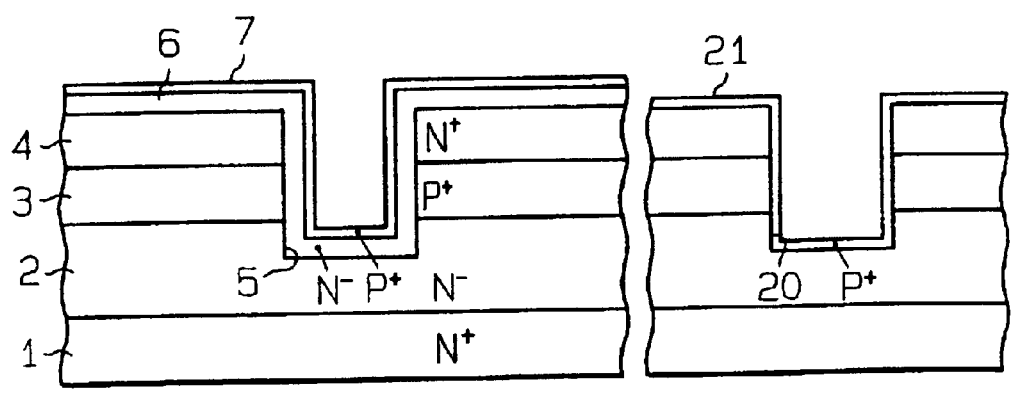

Next, as shown in FIG. 4, an $n^-$-type layer 25 is formed by epitaxial growth on the $n^+$-type source layer 4 and the surface defining the first and second trenches 5, 20. Then, as shown in FIG. 5, the $n^-$-type layer 25 is removed by a predetermined thickness t1 in the area where the protective diode D1 is formed. P-type impurity ions are doped in the $n^-$-type layer 25 by a predetermined depth using thermal diffusion or ion implantation. By the doping, an $n^-$-type layer and a $p^+$-type layer, from which the $n^-$-type channel layer 6 and the $p^+$-type second gate layer 7 are respectively formed, are formed in the first trench 5, and at the same time, an $p^+$-type layer, from which the $p^+$-type impurity layer 21 is formed, is formed in the second trench 20. Other than thermal diffusion and ion implantation, epitaxial growth may be used to form the n⁻-type layer and the p⁺-type layer. When epitaxial growth is used to form the layers, the n⁻-type layer 25 is entirely removed in the area where the protective diode D1 is formed.

Figure 7:
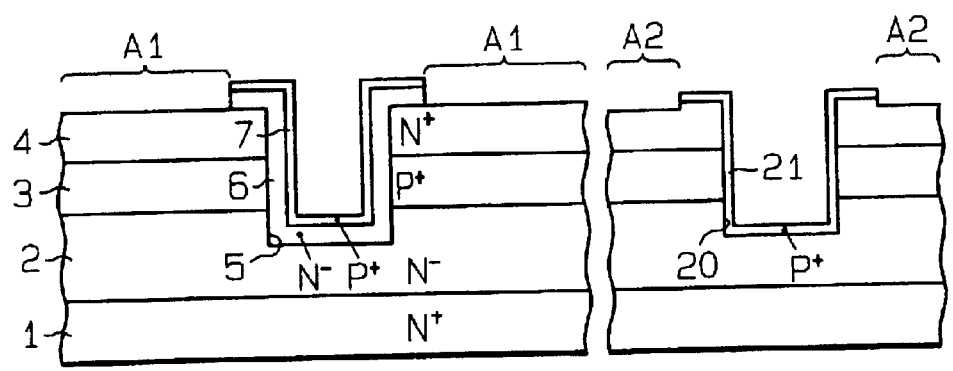
Figure 8:
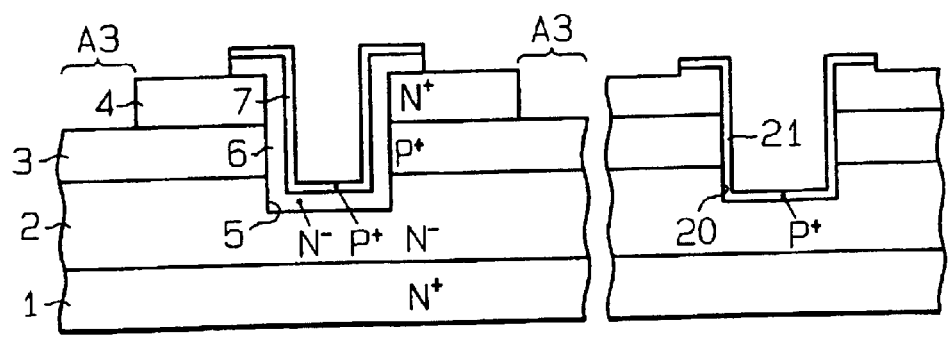

Subsequently, as shown in FIG. 7, the n⁻-type channel layer 6 and the p⁺-type second gate layer 7 are formed by etching the n⁻-type layer and the p⁺-type layer at source contact areas A1 using RIE, and at the same time the p⁺-type impurity layer 21 is formed by etching the p⁺-type layer at source contact areas A2 using RIE. Then, as shown in FIG. 8, the n⁺-type source layer 4 is formed by etching the third epitaxial layer at gate contact areas A3 using RIE.

Next, as shown in FIG. 1, the LTO film 8 is formed. The openings are formed in the LTO film 8. The first gate electrode 9a, 9b, and the second gate electrode 10a, 10b are formed in the area where the JFET J1 is formed. The ohmic contact and wiring electrodes 22a, 22b are formed in the area where the protective diode D1 is formed. The source electrodes 11 are formed in the area where the JFET J1 is formed. Finally, the drain electrode 12 is formed on the back surface of the substrate 1.

By removing the n⁻-type layer 25 by the predetermined thickness t1 in the area where the protective diode D1 is formed, the p⁺-type impurity layer 21 of the protective diode D1 is made closer to the n⁺-type substrate 1 than the p⁺-type second gate layer 7 in the JFET J1 is. By grounding the p⁺-type impurity layer 21 via the electrode including the ohmic contact and wiring electrodes 22a, 22b, minority carriers generated during switching operation of the device are removed. Therefore, the protective diode D1 prevents the minority carriers from destroying the JFET J1.

Second Embodiment

Figure 9:
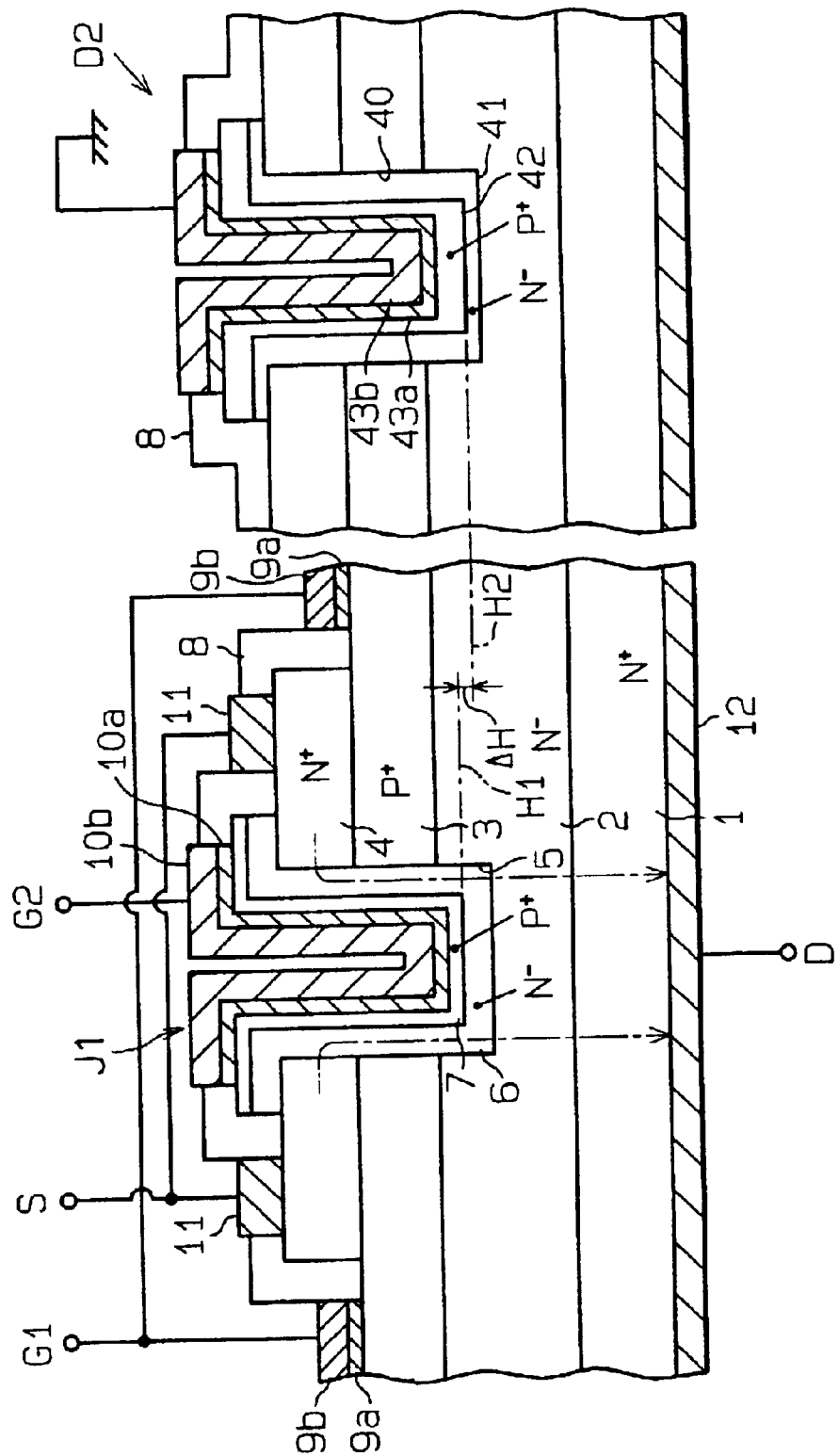
FIG. 9 is a view showing a schematic partial cross-sectional structure and a schematic wiring diagram of a silicon carbide power device according to a second embodiment of the present invention.

As shown in FIG. 9, a silicon carbide power device according to the second embodiment includes a JFET J1 and a protective diode D2, which is a Zener or PN junction diode different in structure from the protective diode D1 of the silicon carbide power device in FIG. 1, as a surge absorber.

In the protective diode D2, a second trench 40 extends from the upper surface of the n⁺-type source layer 4 to the n⁻-type drift layer 2 through the p⁺-type first gate layer 3. An n⁻-type impurity layer 41 (first diode impurity layer) and a p⁺-type impurity layer 42 (second diode impurity layer), which are substantially made of SiC, are located on the surface defining the trench 40. An electrode, which includes an ohmic contact electrode 43a and a wiring electrode 43b, is located on the p⁺-type impurity layer 42 and is grounded. As viewed in FIG. 9, there is a difference ΔH between the bottom level H1 of the p⁺-type second gate layer 7 and the bottom level H2 of the p⁺-type impurity layer 42. The p⁺-type impurity layer 42 of the protective diode D2 is closer to the n⁺-type substrate 1 by ΔH than the p⁺-type second gate layer 7 in the JFET J1 is. With this structure, on the basis of the same mechanism as described in the first embodiment, the protective diode D2 prevents the JFET J1 from being destroyed by an excessive energy due to static electricity, surge energy, and so on, and protects the circuit that controls the gate of the JFET J1 even if such excessive current as surge current is generated in the device.

Figure 10:
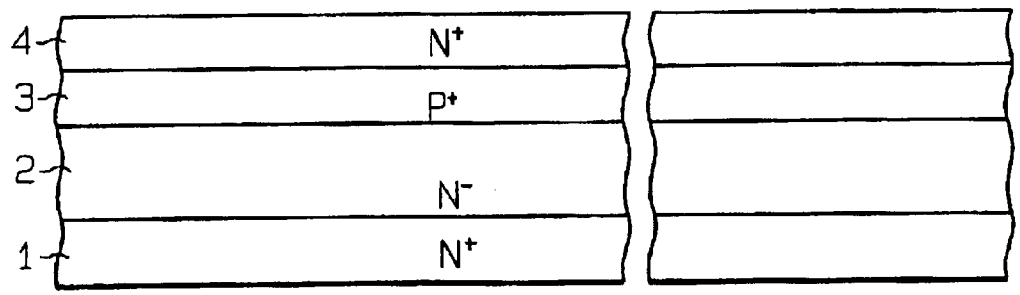
FIGS. 10 to 15 are partial cross-sectional views showing sequential steps of the fabrication process of the silicon carbide power device according to the second embodiment.
Figure 11:
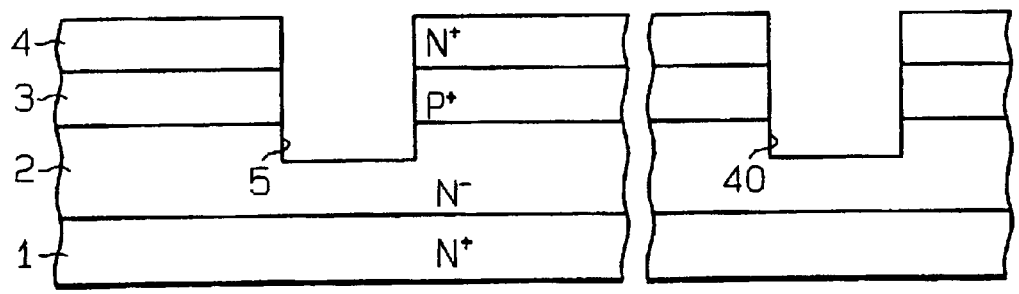

The silicon carbide power device according to the second embodiment is manufactured as follows. Firstly, as shown in FIG. 10, a first epitaxial layer, a second epitaxial layer, and a third epitaxial layer, from which the n⁻-type drift layer 2, the p⁺-type first gate layer 3, and the n⁺-type source layer 4 are respectively formed, are formed in this order on the front surface of the n⁺-type substrate 1, which is substantially made of SiC (4H-SiC). Then, as shown in FIG. 11, the first and second trenches 5, 40, which extend from the upper surface of the epitaxial third layer to the first epitaxial layer through the second epitaxial layer and have the same depth, are simultaneously formed by reactive ion etching (RIE).

Figure 12:
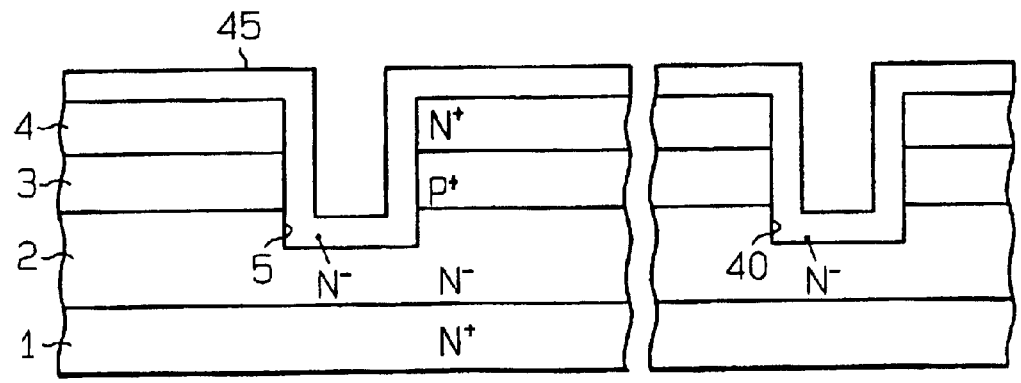
Figure 13:
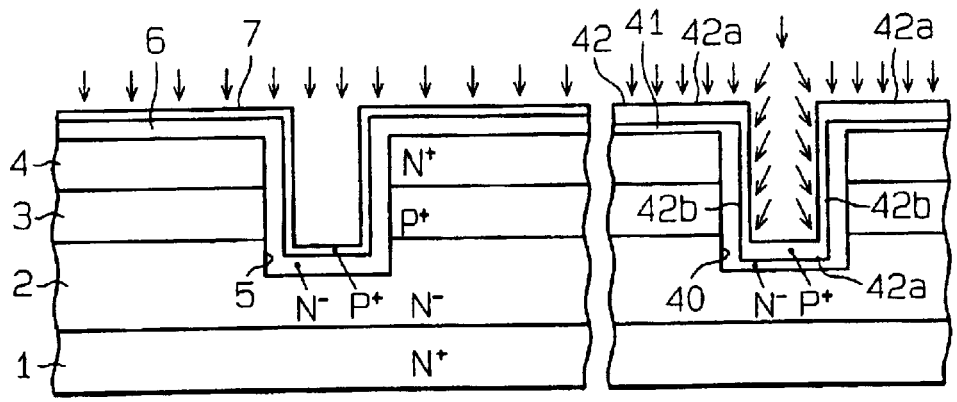

Next, as shown in FIG. 12, an n⁻-type layer 45 is formed by epitaxial growth on the n⁺-type source layer 4 and the surface defining the first and second trenches 5, 40. Then, as shown in FIG. 13, in the area where the JFET J1 is formed, a p⁺-type layer, from which the p⁺-type second gate layer 7 is formed, is formed in the n⁻-type layer 45 by a predetermined thickness using ion implantation. By forming the p⁺-type layer, an n⁻-type layer, from which the n⁻-type channel layer 6 is formed, is formed in the first trench 5 at the same time.

On the other hand, in the area where the protective diode D2 is formed, a thick p⁺-type layer 42a is formed in the n⁻-type layer 45 at the bottom of and outside the trench 40 using vertical ion implantation, and a thin p⁺-type layer 42b is formed in the n⁻-type layer 45 located in the sidewall defining the trench 40 using off-axis ion implantation. For example, the vertical ion implantation and the off-axis ion implantation are conducted at 200 keV and 100 keV, respectively. By forming the thick p⁺-type layer 42a and the thin p⁺-type layer 42b, an n⁻-type layer, from which the n⁻-type impurity layer 41 is formed, is formed in the trench 40 at the same time. The thick p⁺-type layer 42a is thicker than the p⁺-type impurity layer, from which the p⁺-type second gate layer 7 is formed by ΔH. In other words, the n⁻-type layer, from which the n⁻-type impurity layer 41 is formed, is thinner at the bottom of the trench 40 than the n⁻-type layer, from which the n⁻-type channel layer 6 is formed, by ΔH.

Figure 14:
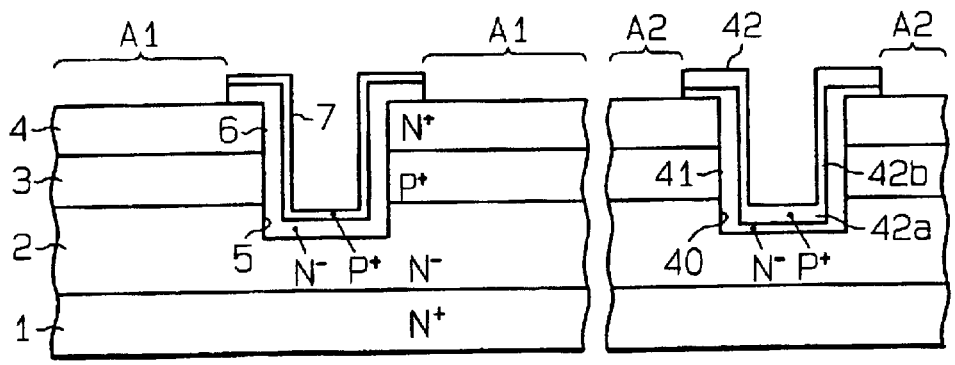
Figure 15:
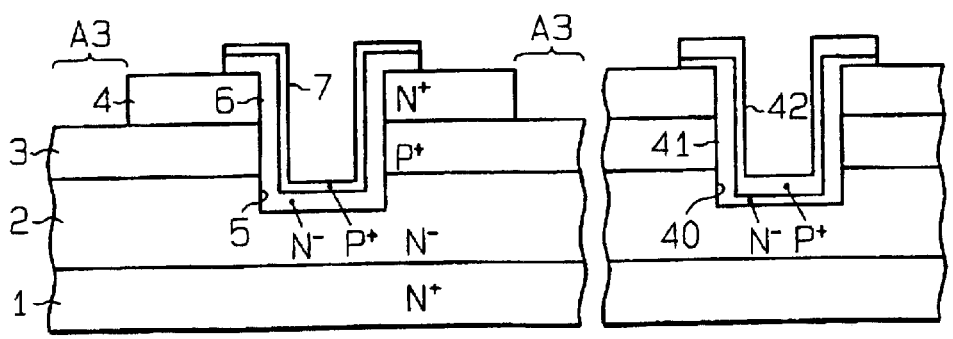

Subsequently, as shown in FIG. 14, the n⁻-type channel layer 6 and the p⁺-type second gate layer 7 are formed by etching the n⁻-type layer and the p⁺-type layer at the source contact areas A1 using RIE, and at the same time the n⁻-type impurity layer 41 and the p⁺-type impurity layer 42 are formed by etching the thick p⁺-type layer 42a and the n⁻-type layer located under the thick p⁺-type layer 42a at the source contact areas A2 using RIE. Then, as shown in FIG. 15, the n⁺-type source layer 4 is formed by etching the third epitaxial layer at the gate contact areas A3 using RIE.

Next, as shown in FIG. 9, the LTO film 8 is formed. The openings are formed in the LTO film 8. The first gate electrode 9a, 9b, and the second gate electrode 10a, 10b are formed in the area where the JFET J1 is formed. The ohmic contact and wiring electrodes 43a, 43b are formed in the area where the protective diode D1 is formed. The source electrodes 11 are formed in the area where the JFET J1 is formed. Finally, the drain electrode 12 is formed on the back surface of the substrate 1.

Third Embodiment

Figure 16:
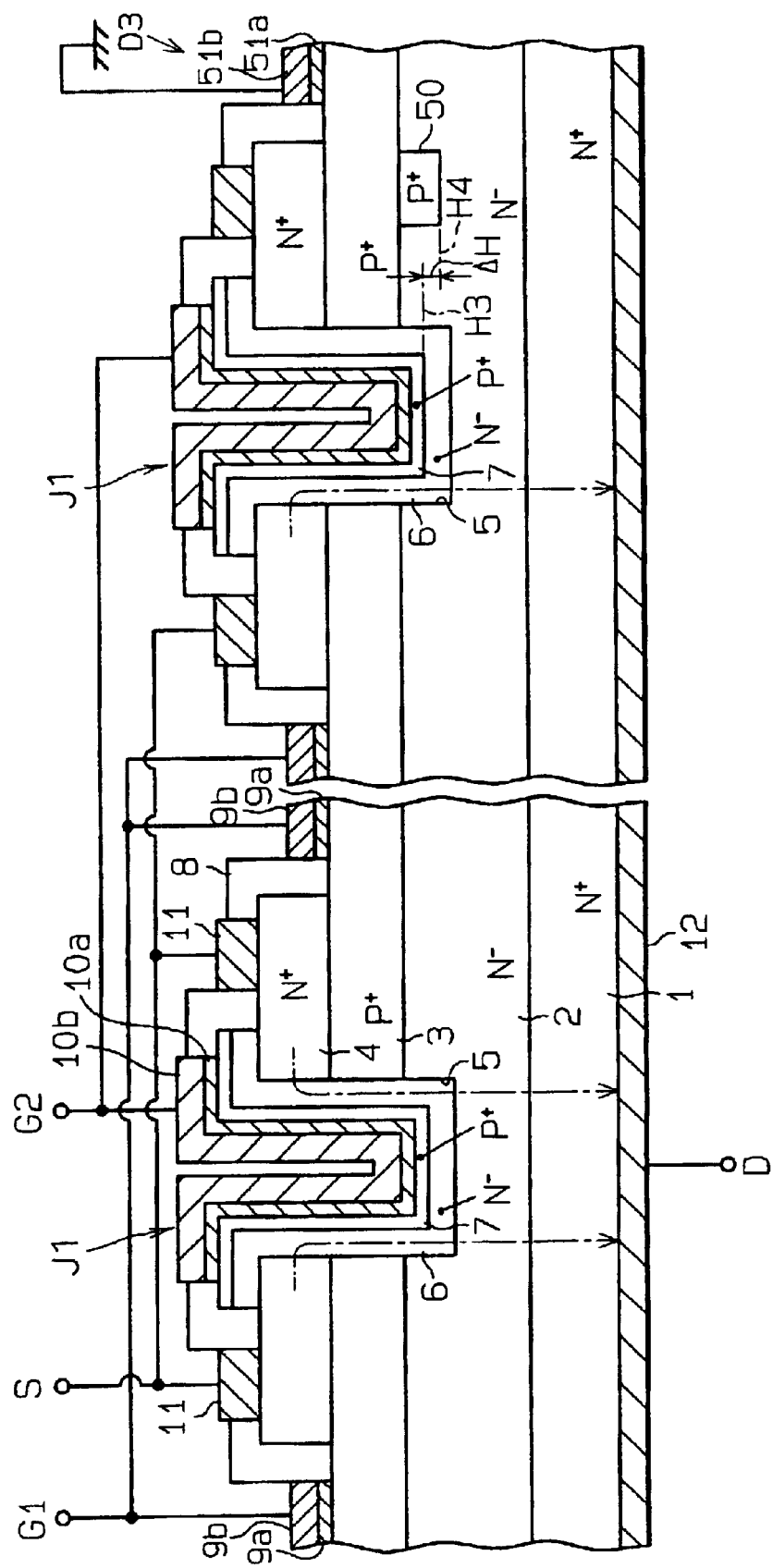
FIG. 16 is a view showing a schematic partial cross-sectional structure and a schematic wiring diagram of a silicon carbide power device according to a third embodiment of the present invention.

As shown in FIG. 16, a silicon carbide power device according to the second embodiment includes two JFETs J1 as silicon carbide power transistors and a protective diode D3, which is a Zener or PN junction diode different in structure from the protective diodes D1, D2 of the silicon carbide power devices in FIGS. 1 and 9, as a surge absorber. The protective diode D3 includes a p⁺-type region 50, which is located in the upper surface of the n⁻-type drift layer 2, and an electrode, which includes an ohmic contact electrode 51a and a wiring electrode 51b, as viewed in FIG. 16. The electrode of the protective diode D3 is located on the upper surface of the p⁺-type first gate layer 3. The electrode of the protective diode D3 is in ohmic contact with the p⁺-type first gate layer 3 and is grounded.

As viewed in FIG. 16, there is a difference ΔH in distance between the bottom level H3 of each p⁺-type second gate layer 7 and the bottom level H4 of the p⁺-type region 50. Therefore, the p⁺-type region 50 is closer to the n⁺-type substrate 1 by ΔH than each p⁺-type second gate layer 7 is. With this structure, on the basis of the same mechanism as described in the first embodiment, the protective diode D3 prevents the JFET J1 from being destroyed by an excessive energy due to static electricity, surge energy, and so on, and protects the circuit that controls the gate of the JFET J1 even if such excessive current as surge current is generated in the device.

Figure 17:
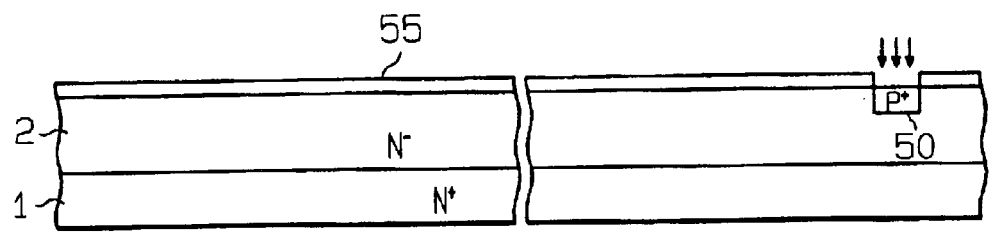
FIGS. 17 to 24 are partial cross-sectional views showing sequential steps of the fabrication process of the silicon carbide power device according to the third embodiment.

The silicon carbide power device according to the third embodiment is manufactured as follows. Firstly, as shown in FIG. 17, a first epitaxial layer, from which the n⁻-type drift layer 2 is formed, is formed on the front surface of the n⁺-type substrate 1, which is substantially made of SiC (4H-SiC). The p⁺-type region 50 is formed in the upper surface of the first epitaxial layer by implanting impurity ions, which are aluminum or boron, into the first epitaxial layer using a patterned LTO film 55 as a mask.

Figure 18:
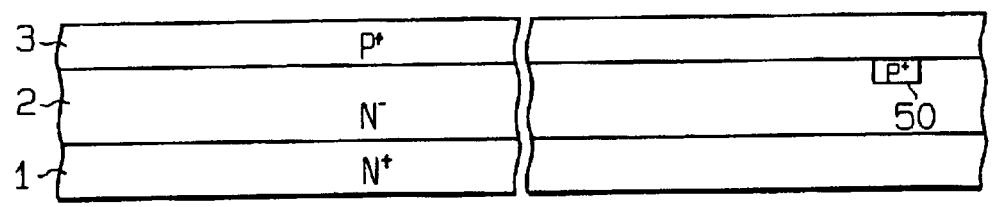
Figure 19:
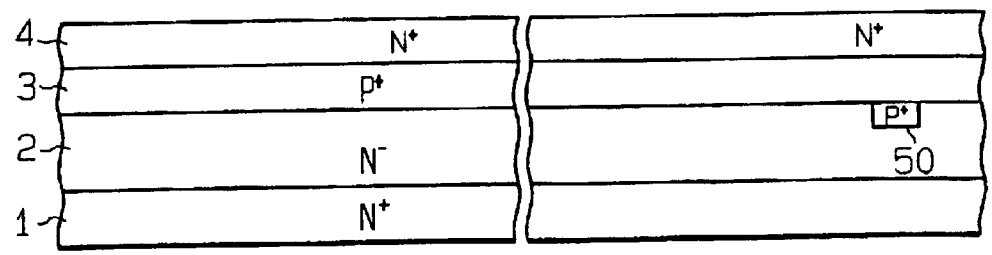
Figure 20:
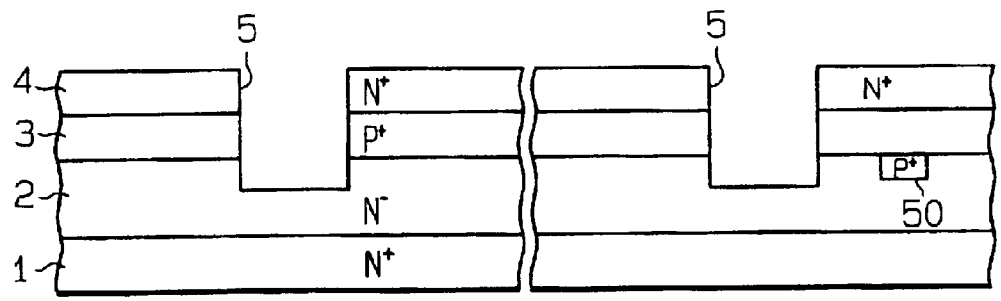

Then, as shown in FIGS. 18 and 19, a second epitaxial layer, and a third epitaxial layer, from which the p⁺-type first gate layer 3 and the n⁺-type source layer 4 are respectively formed, are formed. Then, as shown in FIG. 20, the first trenches 5, which extend from the upper surface of the third layer to the first layer through the second layer, are formed by reactive ion etching (RIE).

Figure 21:
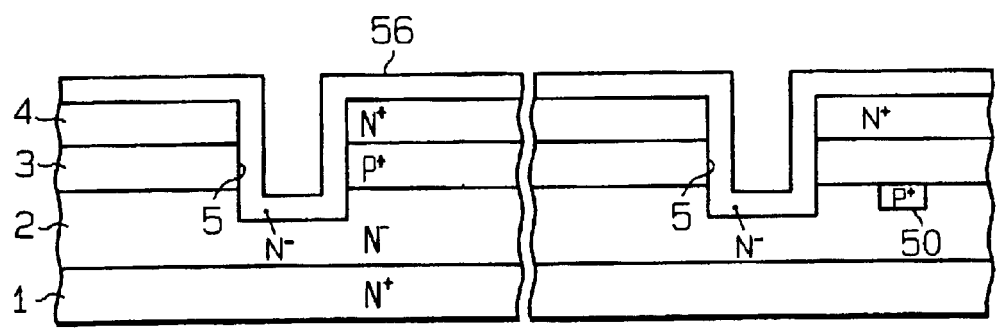
Figure 22:
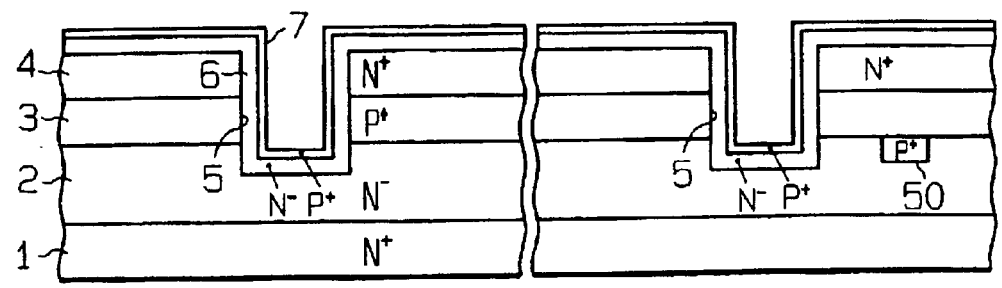

Next, as shown in FIG. 21, an n⁻-type layer 56 is formed by epitaxial growth on the n⁺-type source layer 4 and the surface defining the first trenches 5. Then, as shown in FIG. 22, a p⁺-type layer, from which the p⁺-type second gate layer 7 is formed, is formed in the n⁻-type layer 56 by a predetermined thickness using thermal diffusion or ion implantation. By forming the p⁺-type layer, an n⁻-type layer, from which the n⁻-type channel layer 6 is formed, is formed in the first trenches 5 at the same time. Other than thermal diffusion and ion implantation, epitaxial growth may be used to form the p⁺-type layer.

Figure 23:
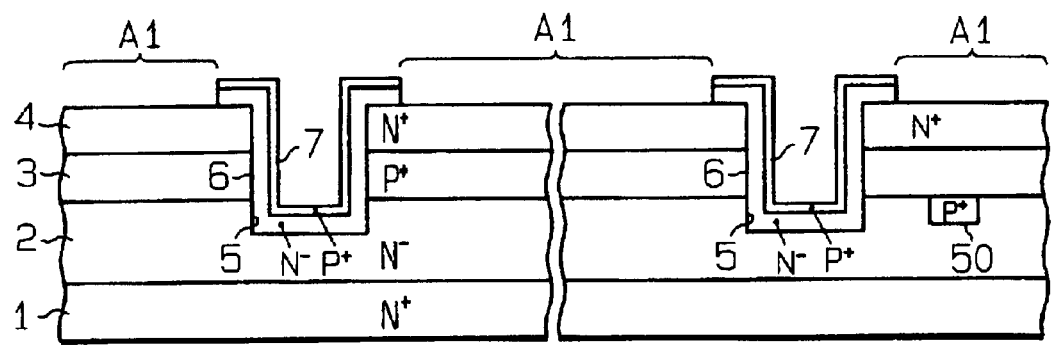
Figure 24:
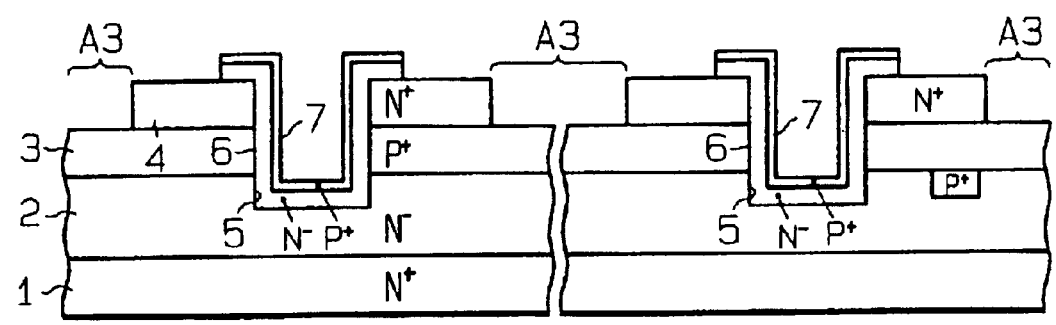

Subsequently, as shown in FIG. 23, the n⁻-type channel layer 6 and the p⁺-type second gate layer 7 are formed by etching the n⁻-type layer and the p⁺-type layer at the source contact areas A1 using RIE. Then, as shown in FIG. 24, the n⁺-type source layer 4 is formed by etching the third epitaxial layer at the gate contact areas A3 using RIE. Next, as shown in FIG. 16, the LTO film 8 is formed. The openings are formed in the LTO film 8. The first gate electrodes 9a, 9b, and the second gate electrodes 10a, 10b are formed in the areas where the JFETs J1 are formed. The ohmic contact and wiring electrodes 51a, 51b are formed in the area where the protective diode D3 is formed. The source electrodes 11 are formed in the areas where the JFETs J1 are formed. Finally, the drain electrode 12 is formed on the back surface of the substrate 1.

As described above, the difference ΔH, which is shown in FIG. 16, between the bottom level H3 of each p⁺-type second gate layer 7 and the bottom level H4 of the p⁺-type region 50 is made by forming the p⁺-type region 50 in the upper surface of the first epitaxial layer by ion implantation, as shown in FIGS. 17 and 18.

Fourth Embodiment

Figure 25:
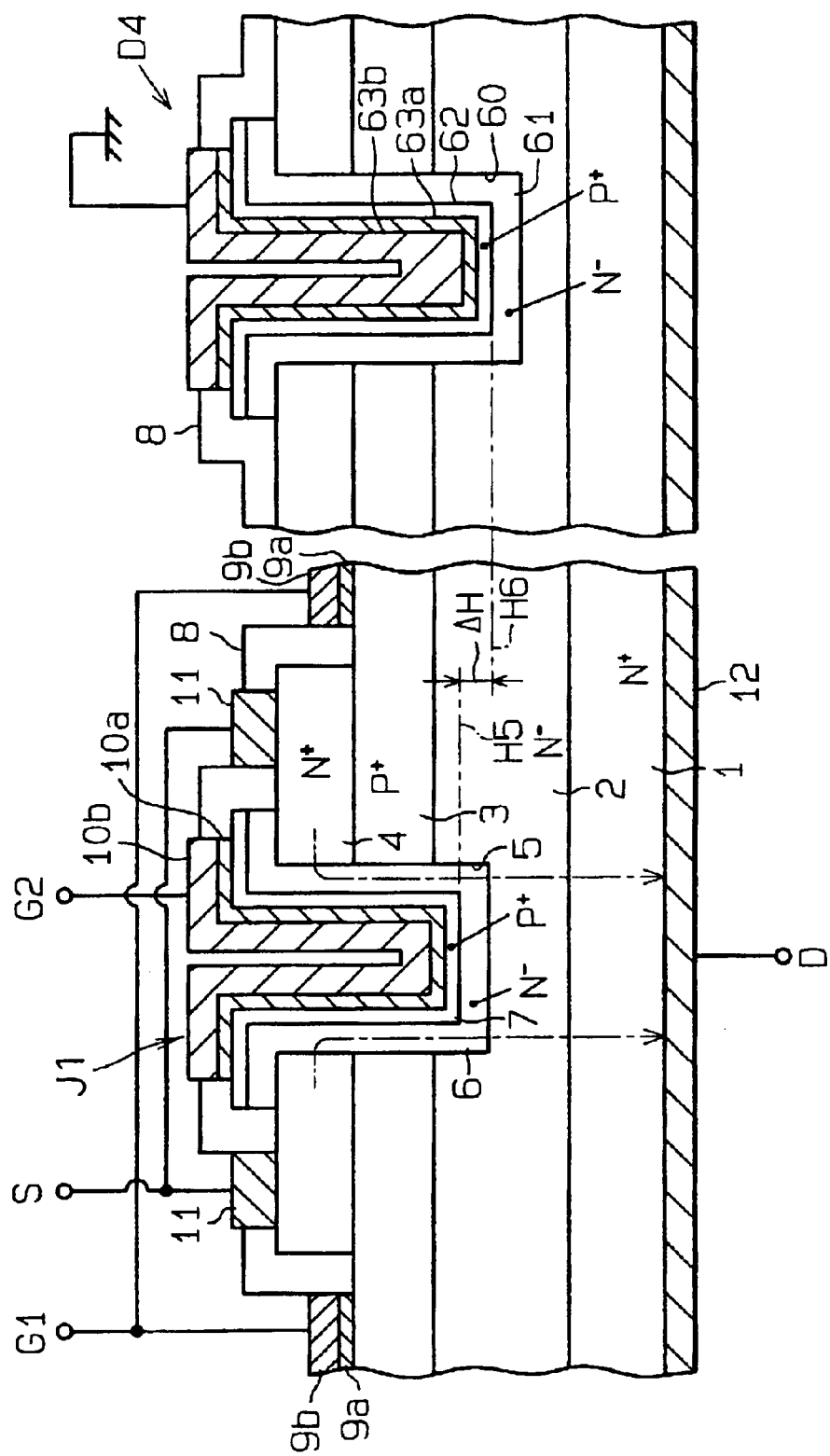
FIG. 25 is a view showing a schematic partial cross-sectional structure and a schematic wiring diagram of a silicon carbide power device according to a fourth embodiment of the present invention.

As shown in FIG. 25, a silicon carbide power device according to the fourth embodiment includes a JFET J1 and a protective diode D4, which is a Zener or PN junction diode different in structure from the above protective diodes D1, D2, D3 of the silicon carbide power devices in FIGS. 1, 9, and 16, as a surge absorber.

In the protective diode D4, a second trench 60, which is deeper than the first trench 5 of the JFET J1, extends from the upper surface of the n⁺-type source layer 4 to the n⁻-type drift layer 2 through the p⁺-type first gate layer 3. An n⁻-type impurity layer 61 (first diode impurity layer) and a p⁺-type impurity layer 62 (second diode impurity layer), which are substantially made of SiC, are located on the surface defining the second trench 60. As viewed in FIG. 25, there is a difference ΔH between the bottom level H5 of the p⁺-type second gate layer 7 and the bottom level H2 of the p⁺-type impurity layer 62. An electrode, which includes an ohmic contact electrode 63a and a wiring electrode 63b, is located on the p⁺-type impurity layer 62 and is grounded. The p⁺-type impurity layer 62 of the protective diode D4 is closer to the n⁺-type substrate 1 by ΔH than the p⁺-type second gate layer 7 of the JFET J1 is. With this structure, on the basis of the same mechanism as described in the first embodiment, the protective diode D4 prevents the JFET J1 from being destroyed by an excessive energy due to static electricity, surge energy, and so on, and protects the circuit that controls the gate the JFET J1 even if such excessive current as surge current is generated in the device.

Figure 26:
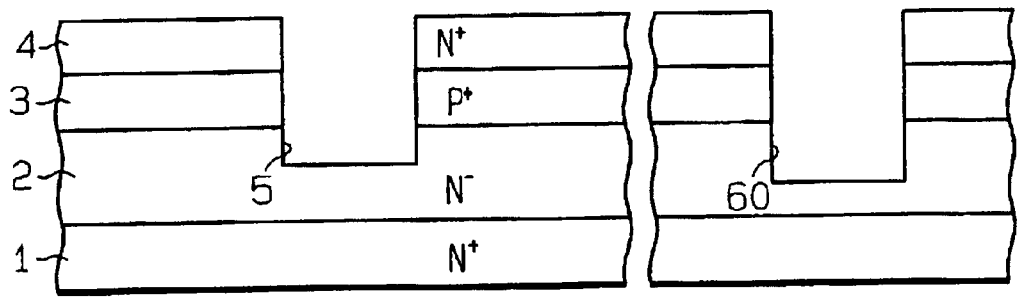
FIGS. 26 to 30 are partial cross-sectional views showing sequential steps of the fabrication process of the silicon carbide power device according to the fourth embodiment.

The silicon carbide power device according to the fourth embodiment is manufactured as follows. Firstly, a first epitaxial layer, a second epitaxial layer, and a third epitaxial layer, from which the n⁻-type drift layer 2, the p⁺-type first gate layer 3, and the n⁺-type source layer 4 are respectively formed, are formed in this order on the front surface of the n⁺-type substrate 1, which is substantially made of SiC (4H-SiC). Then, as shown in FIG. 26, the first and second trench 5, 60, which extend from the upper surface of the third layer to the first layer through the second layer, are formed by reactive ion etching (RIE) such that the second trench 60 is deeper than the first trench 5.

Figure 27:
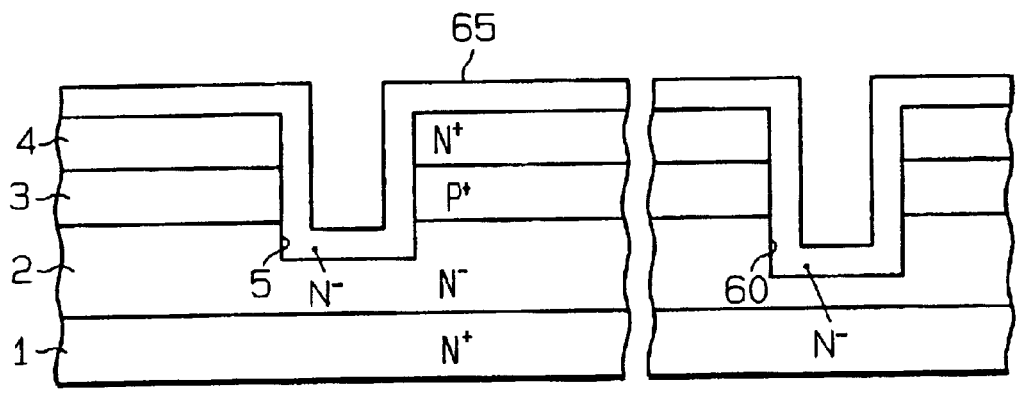
Figure 28:
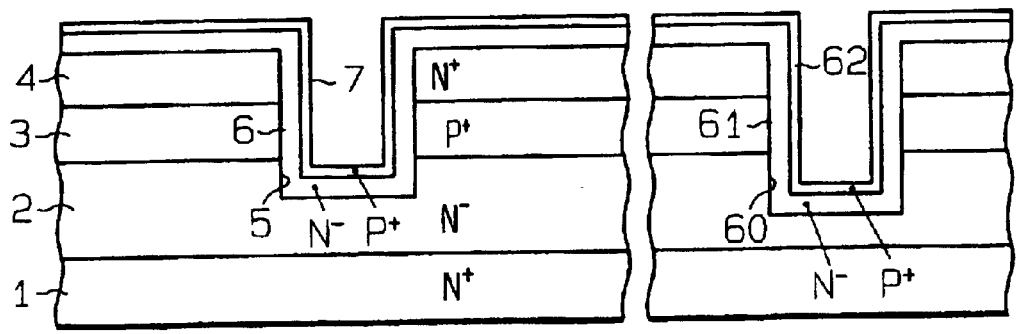

Next, as shown in FIG. 27, an n⁻-type layer 65 is formed by epitaxial growth on the n⁺-type source layer 4 and the surface defining the first and second trenches 5, 60. Then, as shown in FIG. 28, a p⁺-type layer, from which the p⁺-type second gate layer 7 and the p⁺-type impurity layer 62 are formed, is formed in the n⁻-type layer 65 by a predetermined thickness using thermal diffusion. By forming the p⁺-type layer, an n⁻-type layer, from which the n⁻-type channel layer 6 and the n⁻-type impurity layer 61 are formed, is formed at the same time.

Figure 29:
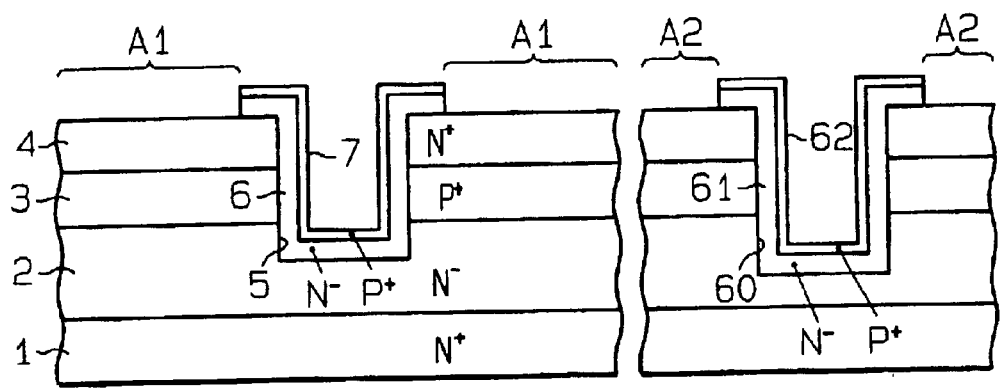
Figure 30:
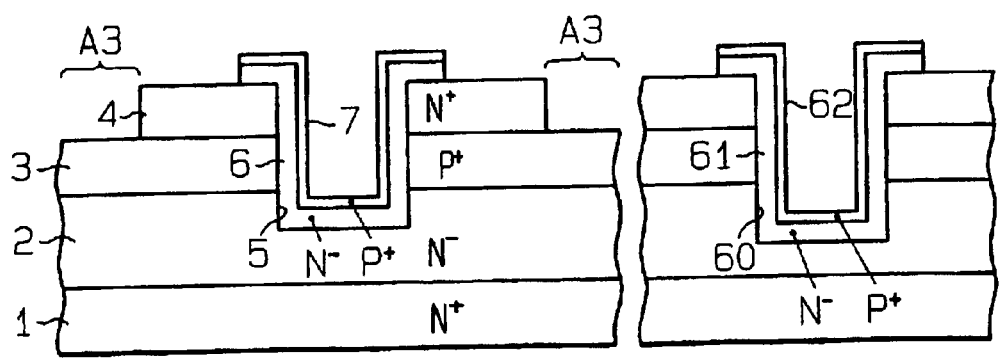

Subsequently, as shown in FIG. 29, the n⁻-type channel layer 6 and the p⁺-type second gate layer 7 are formed by etching the n⁻-type layer and the p⁺-type layer at the source contact areas A1 using RIE, and at the same time the n⁻-type impurity layer 61 and the p⁺-type impurity layer 62 are formed by etching the n⁻-type layer and the p⁺-type layer at the source contact areas A2. Then, as shown in FIG. 30, the n⁺-type source layer 4 is formed by etching the third epitaxial layer at the gate contact areas A3 using RIE.

Next, as shown in FIG. 25, the LTO film 8 is formed. The openings are formed in the LTO film 8. The first gate electrode 9a, 9b, and the second gate electrode 10a, 10b are formed in the area where the JFET J1 is formed. The ohmic contact and wiring electrodes 63a, 63b are formed on the p⁺-type impurity layer 62. The source electrodes 11 are formed in the area where the JFET J1 is formed. Finally, the drain electrode 12 is formed on the back surface of the substrate 1.

Fifth Embodiment

Figure 31:
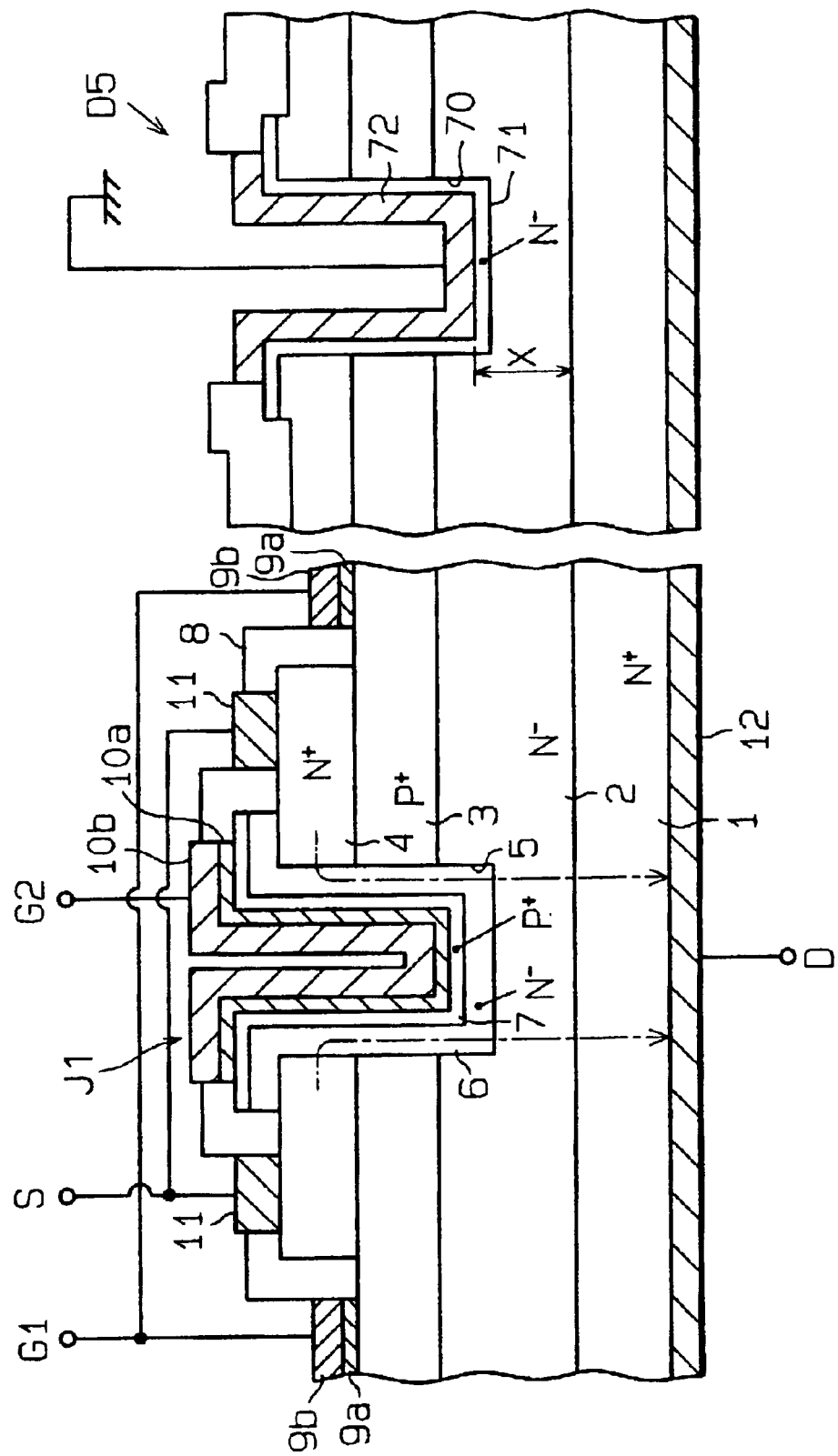
FIG. 31 is a view showing a schematic partial cross-sectional structure and a schematic wiring diagram of a silicon carbide power device according to a fifth embodiment of the present invention.

As shown in FIG. 31, a silicon carbide power device according to the fifth embodiment includes a JFET J1 and a protective diode D5 as a surge absorber, which is different in type from the above protective diodes D1, D2, D3, D4 of the silicon carbide power devices in FIGS. 1, 9, 16, and 25.

The protective diode D5 is a Schottky diode. The protective diode D5 accounts for 10 to 50% of the entire area of the silicon carbide power device. In the protective diode D5, a second trench 70 extends from the upper surface of the n$^+$-type source layer 4 to the n$^-$-type drift layer 2 through the p$^+$-type first gate layer 3. An n$^-$-type impurity layer 71, which is substantially made of SiC, is located on the surface defining the second trench 70. An electrode 72 is located on the n$^-$-type impurity layer 71 and is grounded. The Schottky junction of the protective diode D5 has a breakdown voltage lower than the PN junction formed with the p$^+$-type first gate layer 3 and the n$^-$-type drift layer 2 in the JFET J1. Therefore, the protective diode D5 prevents the JFET J1 from being destroyed by an excessive energy due to static electricity, surge energy, and so on, and protects the circuit that controls the gate the JFET J1 even if such excessive current as surge current is generated in the device. Thus, no external flywheel diode is needed when the device is used as a switching device.

The breakdown voltage of the protective diode D5 is controlled using the Schottky barrier height, that is, using the metal such as nickel and titan as the electrode 72. The breakdown voltage of the protective diode D5 is also controlled by adjusting the distance X shown in FIG. 31, which is the distance between the boundary between the electrode 72 and the n$^-$-type impurity layer 71, that is, the boundary of the Schottky junction, and the boundary between the n$^-$-type drift layer 2 and the substrate 1.

The silicon carbide power device according to the fifth embodiment is manufactured as follows. Firstly, a first epitaxial layer, a second epitaxial layer, and a third epitaxial layer, from which the n$^-$-type drift layer 2, the p$^+$-type first gate layer 3, and the n$^+$-type source layer 4 are respectively formed, are formed in this order on the front surface of the n$^+$-type substrate 1, which is substantially made of SiC (4H-SiC). Then, the first and second trenches 5, 70, which extend from the upper surface of the third layer to the first layer through the second layer, are simultaneously formed by reactive ion etching (RIE).

Figure 32:
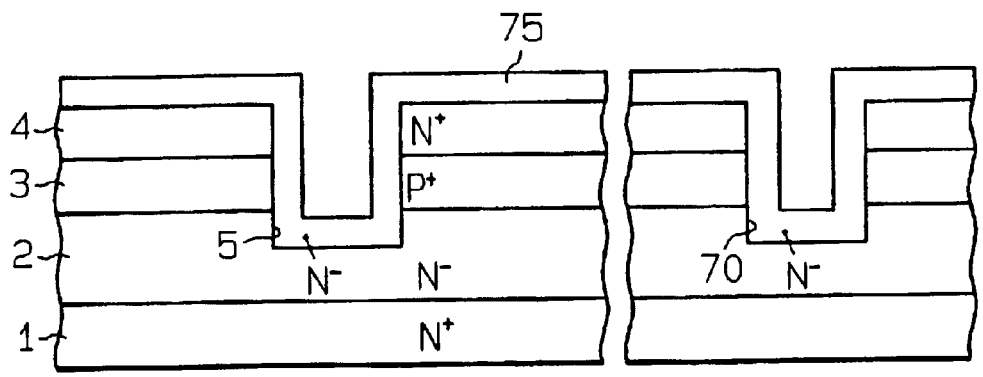
FIGS. 32 to 37 are partial cross-sectional views showing sequential steps of the fabrication process of the silicon carbide power device according to the fifth embodiment.
Figure 33:
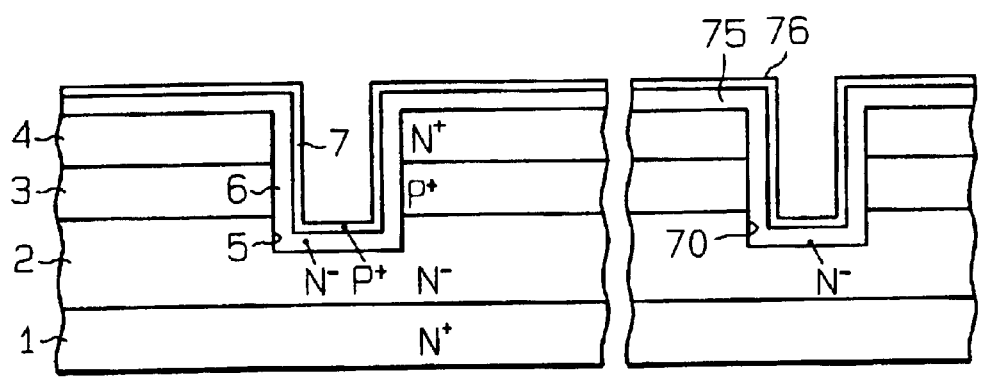

Next, as shown in FIG. 32, an n$^-$-type layer 75 is formed by epitaxial growth on the n$^+$-type source layer 4 and the surface defining the first and second trenches 5, 70. Then, as shown in FIG. 33, a p$^+$-type layer, from which the p$^+$-type second gate layer 7 is formed in the area where the JFET J1 is formed, and a p$^+$-type impurity layer 76 are formed in the n$^-$-type layer 75 by a predetermined thickness using thermal diffusion or thermal diffusion. Other than thermal diffusion and ion implantation, epitaxial growth may be used to form the p$^+$-type layer and the p$^+$-type impurity layer 76. By forming the p$^+$-type layer, an n$^-$-type layer, from which the n$^-$-type channel layer 6 is formed, is formed at the same time.

Figure 34:
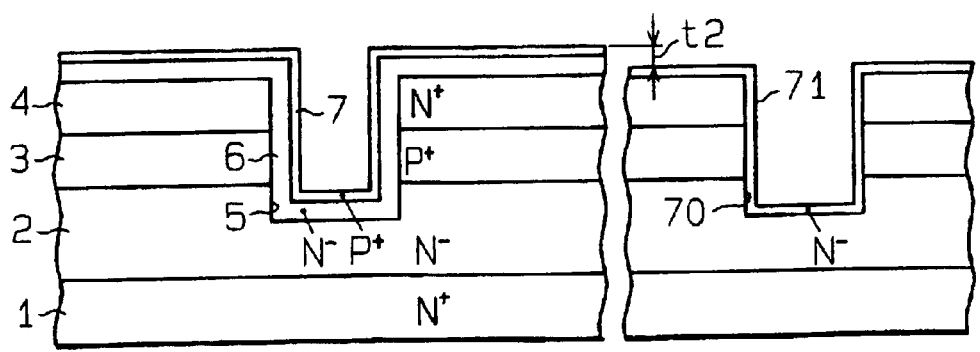
Figure 35:
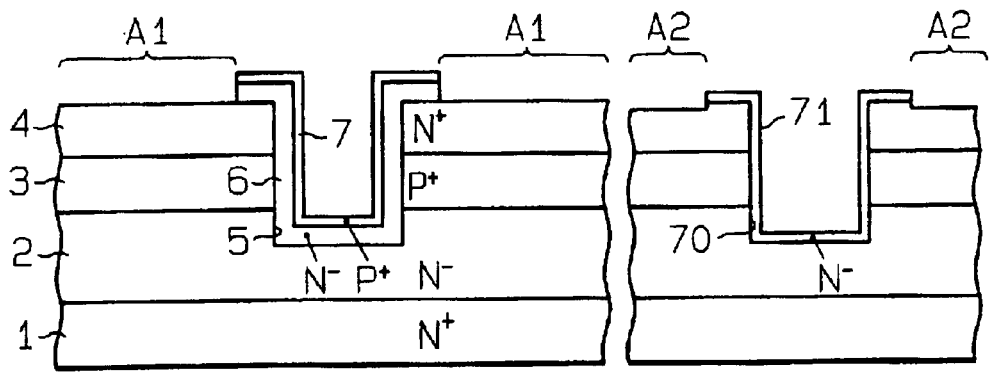
Figure 36:
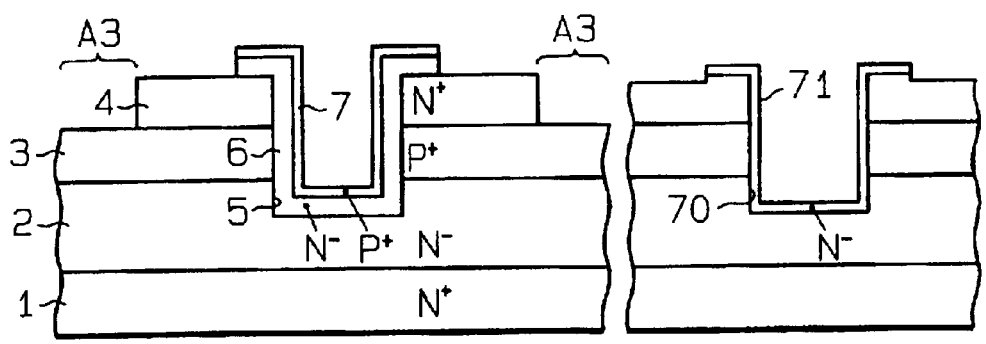

Then, as shown in FIG. 34, the n$^-$-type layer 75 is etched by a predetermined thickness t2 to form an n$^-$-type layer, from which the n$^-$-type impurity layer 71 is formed, in the area where the protective diode D5 is formed. Subsequently, as shown in FIG. 35, the n$^-$-type channel layer 6 and the p$^+$-type second gate layer 7 are formed by etching the n$^-$-type layer and the p$^+$-type layer at the source contact areas A1 using RIE in the area where the JFET J1 is formed, and at the same time the n$^-$-type impurity layer 71 is formed by etching the n$^-$-type layer at the source contact areas A2 in the area where the protective diode D5 is formed. Then, as shown in FIG. 36, the n$^+$-type source layer 4 is formed by etching the third epitaxial layer at the gate contact areas A3 using RIE.

Figure 37:
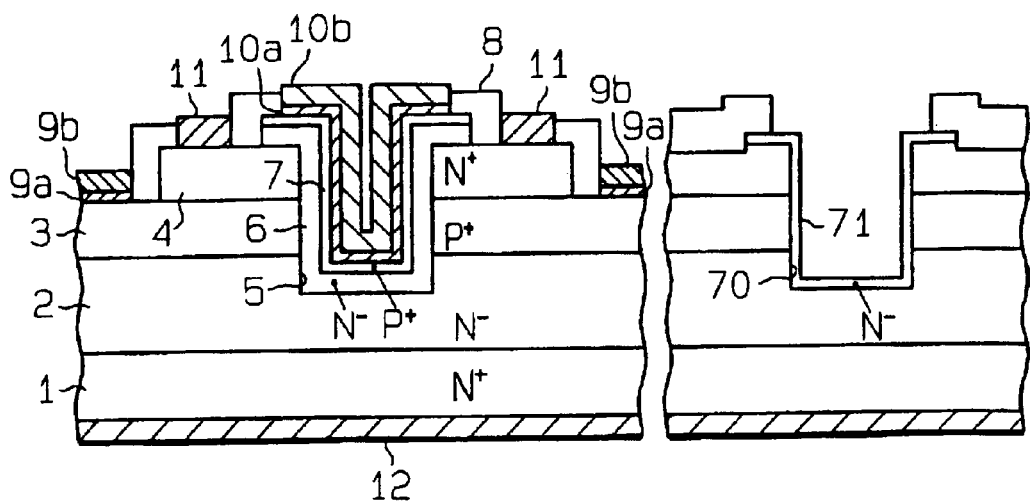

Next, as shown in FIG. 37, the LTO film 8 is formed. The openings are formed in the LTO film 8. The first gate electrode 9a, 9b, and the second gate electrode 10a, 10b are formed in the area where the JFET J1 is formed. The source electrodes 11 are formed in the area where the JFET J1 is formed. A layer, from which the drain electrode 12 is formed, is formed on the back surface of the substrate 1, and the drain electrode 12 is formed by annealing the layer at 1000° C. to form ohmic contact. Finally, as shown in FIG. 31, the electrode 72 is formed on the n$^-$-type impurity layer 71. A Schottky barrier is formed between the electrode 72, which is made of metal such as nickel and titan, and the n$^-$-type impurity layer 71, which is substantially made of SiC.

Sixth Embodiment

Figure 38:
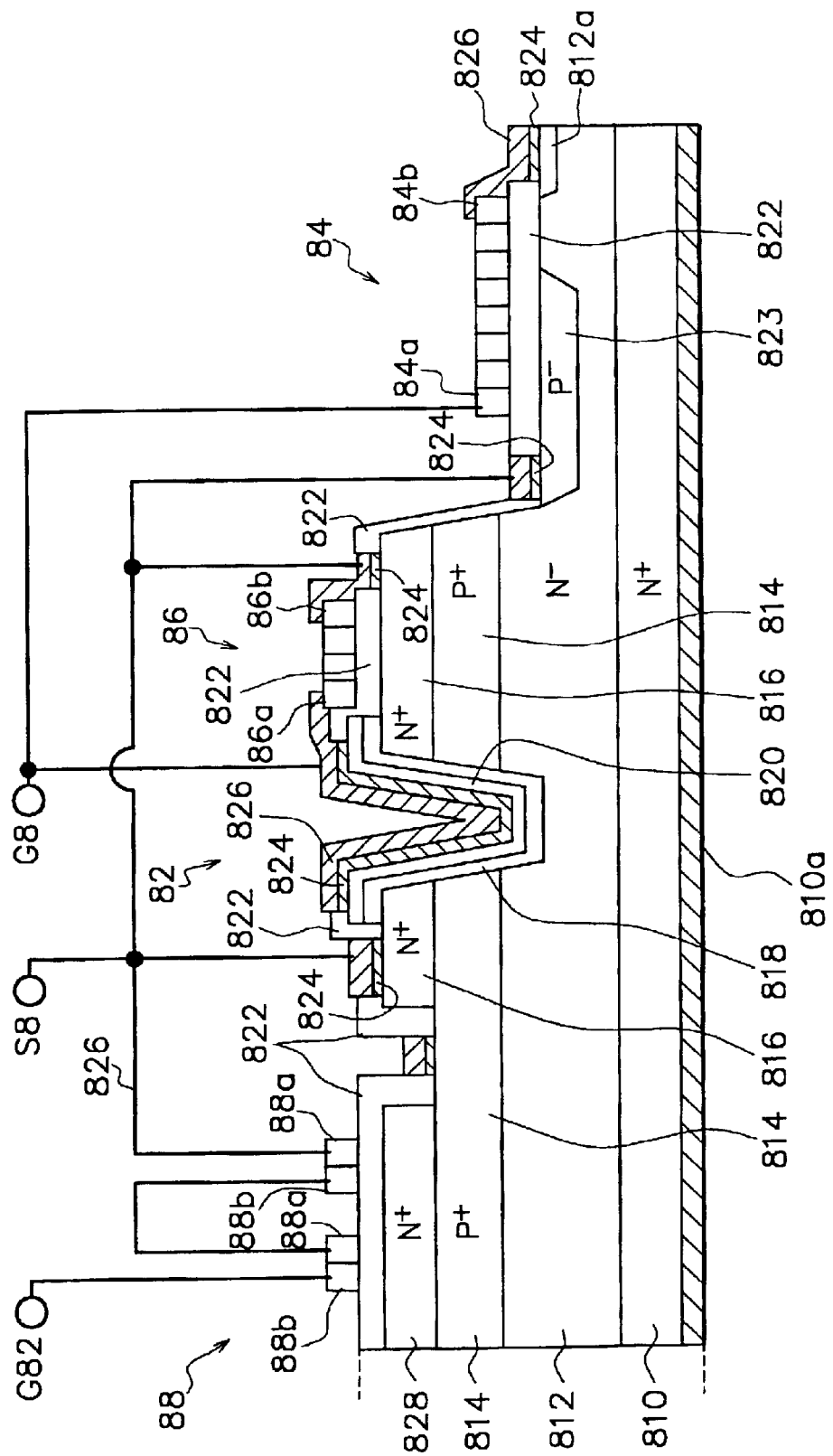
FIG. 38 is a view showing a schematic partial cross-sectional structure and a schematic wiring diagram of a silicon carbide power device according to a sixth embodiment of the present invention.

As shown in FIG. 38, a silicon carbide power device according to the sixth embodiment includes a JFET 82 as a silicon carbide power transistor, a first protective diode 84 as a surge absorber, a junction termination edge member (JTE member), a second protective diode 86, and a third protective diode 88, which is thermo-sensitive. The diodes 84, 86, 88 are Zener diodes. The silicon carbide power device according to the sixth embodiment includes an n$^+$-type substrate 810, which has a first conduction type, an n$^-$-type drift layer 812, which has the first conduction type, a p$^+$-type first JFET impurity layer 814, which has a second conduction type, a first n$^+$-type source layer 816, which has the first conduction type, and a second n$^+$-type source layer 828, which has the first conduction type. The substrate 810 and the layers 812, 814, 816, 828 are substantially made of silicon carbide (SiC). The substrate 810 has a front surface and a back surface, which is opposite from the front surface. The layers 812, 814, 816, 828 are sequentially layered in the above order on the front surface of the substrate 810. The impurity concentration of the n$^-$-type drift layer 812 is lower than those of the n$^+$-type substrate 810 and the first and second n$^+$-type source layers 816, 828.

In the JFET 82, a trench extends from the upper surface of the first n$^+$-type source layer 816 to the n$^-$-type drift layer 812 through the p$^+$-type first JFET impurity layer 814. An n$^-$-type channel layer 818, which are substantially made of SiC, is located on the surface defining the trench. A p$^+$-type second JFET impurity layer 820, which are substantially made of SiC, is located on the n$^-$-type channel layer 818. As viewed in FIG. 38, the bottom of the p$^+$-type second JFET impurity layer 820 is located under the boundary between the n$^-$-type drift layer 812 and the p$^+$-type first JFET impurity layer 814. An LTO film 822, which is an insulating oxide film, which is made by low temperature CVD, is located on the first and second n$^+$-type source layers 816, 828.

In the silicon carbide power device in FIG. 38, a plurality of aluminum wires 826 electrically connect between elementals making up the device. The LTO film 822 has a plurality of openings. An ohmic contact electrode 824 is located in each opening. On each ohmic contact electrode 824, a wiring electrode, which is a terminal part of one of aluminum wires 826, is located. A drain electrode 810a is located on the entire back surface of the substrate 810. The drain current of the JFET of the silicon carbide power device in FIG. 38 is controlled by the width of a channel. The width of the channel is determined by the width of the depletion layer of the channel layer 818 located between the p⁺-type first and second JFET impurity layers 814, 820. Therefore, at least one of the p⁺-type first and second JFET impurity layers 814, 820 functions a gate of the JFET 82.

The first protective diode 84 is electrically connected to the n⁻-type drift layer 812 and the p⁺-type second JFET impurity layer 820 of the JFET 82. A periphery of the device includes none of the p⁺-type first JFET impurity layer 814 and the first and second n⁺-type source layers 816, 828. The JTE member is located at the periphery and includes a part of the n⁻-type drift layer 812 and a p⁻-type region 823, which is located in a surface of the n⁻-type drift layer 812. As viewed in FIG. 38, the p⁻-type region 823 tapers off toward the bottom. The impurity concentration of the p⁻-type region 823 is lower than the p⁺-type first JFET impurity layer 814. The p⁻-type region 823 is electrically connected to the first n⁺-type source layer 816. An n-type region 812a, the impurity concentration of which is higher than the n⁻-type drift layer 812, is located in a surface of the n⁻-type drift layer 812.

The first protective diode 84 is located on the LTO film 822, which is located on the drift layer 812 and the p⁻-type region 823 at the periphery. The first protective diode 84 includes a plurality of Zener diodes, which are directly connected together in series. Each Zener diode includes an n-type region 4a and a p-type region 4b, which are substantially made of polycrystalline silicon. The first protective diode 84 has a predetermined breakdown voltage VZ1. One end (first end) of the first protective diode 84, which is one of the n-type regions 4a, is electrically connected to a gate terminal G8, which has the same potential as the gate of the JFET 82, by one of the aluminum wires 826, and the other end (second end), which is one of the p-type regions 4b, is electrically connected to the drift layer 812 by another one of the aluminum wires 826, one of the ohmic contact electrodes 824, and the n-type region 812a. The one of the aluminum wires 826 and the one of the ohmic contact electrodes 824 make up an equivalent potential ring (EQR), which is electrically connected to the n-type region 812a to have the same potential as the n⁻-type drift layer 812, which functions as a drain of the JFET 82.

The second protective diode 86 is located on the LTO film 822 that is located on the n⁺-type source layer 816 in the vicinity of the JFET 82. The second protective diode 86 includes a plurality of Zener diodes, which are directly connected in series. Each Zener diode includes an n-type region 86a and a p-type region 86b, which are substantially made of polycrystalline silicon. The second protective diode 86 has a predetermined breakdown voltage VZ2. One end (first end) of the second protective diode 86, which is one of the n-type regions 86a, is electrically connected to the gate terminal G8 by one of the aluminum wires 826, and the other end (second end), which is one of the p-type regions 86b, is electrically connected to a source terminal S8 by another one of the aluminum wires 826, as shown in FIG. 38.

The third protective diode 88 is located on the LTO film 822 that is located on the second n⁺-type source layer 828. The third protective diode 88 in the device in FIG. 38 includes two Zener diodes, which are connected in series by one of the aluminum wires 826. Each Zener diode includes an n-type region 88a and a p-type region 88b, which are substantially made of polycrystalline silicon. The first n⁺-type source layer 816, which is electrically connected to the third protective diode 88, electrically separated from the n⁻-type drift layer 812 by the p⁺-type first JFET impurity layer 814. Therefore, the third protective diode 88 is electrically separated from the n⁻-type drift layer 812. One end (first end) of the third protective diode 88, which is one of the n-type regions 88a, is electrically connected to the source terminal S8 by one of the aluminum wires 826, and the other end (second end), which is one of the p-type regions 88b, is electrically connected to a gate terminal G82 by another one of the aluminum wires 826.

Figure 39:
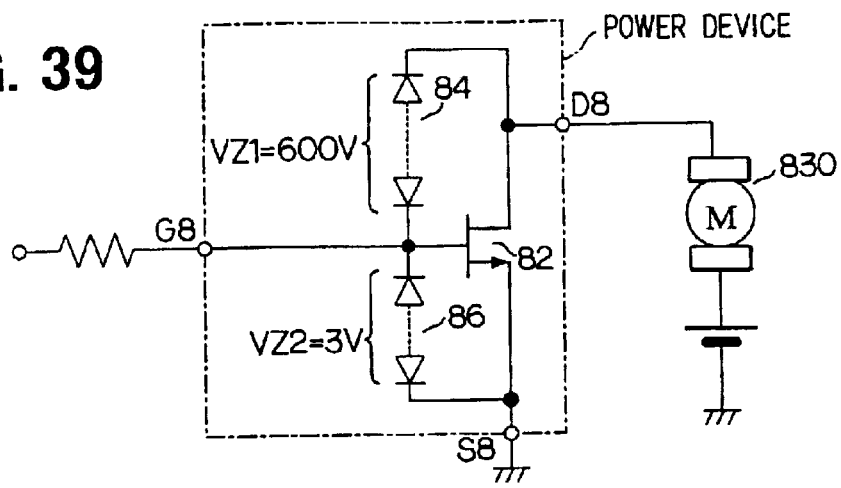
FIG. 39 is a schematic circuit diagram of a motor control system including the power device in FIG. 38.

The silicon carbide power device in FIG. 38 may be used in an electric system such as a motor control system shown in FIG. 39, in which the third protective diode 88 is not illustrated. In the motor control system, the JFET 82 of the device is protected against the flyback energy from the inductive load generated by a motor 830 by the first protective diode 84 and the second protective diode 86. In the silicon carbide power device of the motor control system shown in FIG. 39, the breakdown voltage VZ2 of the second protective diode 86 is set to be higher than the threshold voltage Vt of the JFET 82, at which the JFET is turned on. On the other hand, the breakdown voltage VZ2 is set to be lower than the built-in potential Vbi that is formed between the p⁺-type second JFET impurity layer 820 and the first n⁺-type source layer 816 because if minority carriers are stored in the JFET 82, the switching of the JFET 82 slows down and the load of a driving circuit increases. In addition, the breakdown voltage VZ1 of first protective diode 84 is set such that the sum of the breakdown voltages VZ1, VZ2 is lower than the breakdown voltage BV of the PN junction between the n⁻-type drift layer 812 and the first n⁺-type source layer 816, so the first and second diodes 84, 86 prevent the JFET 82 from being destroyed by the flyback energy.

Specifically, in the silicon carbide power device of the motor control system shown in FIG. 39, the breakdown voltage BV, the built-in potential Vbi, the threshold voltage Vt, the breakdown voltage VZ1 of the first protective diode 84, and the breakdown voltage VZ2 of the second protective diode 86 are 700V, 3.1V, 1V, 600V, and 3V, respectively.

Figure 40A:
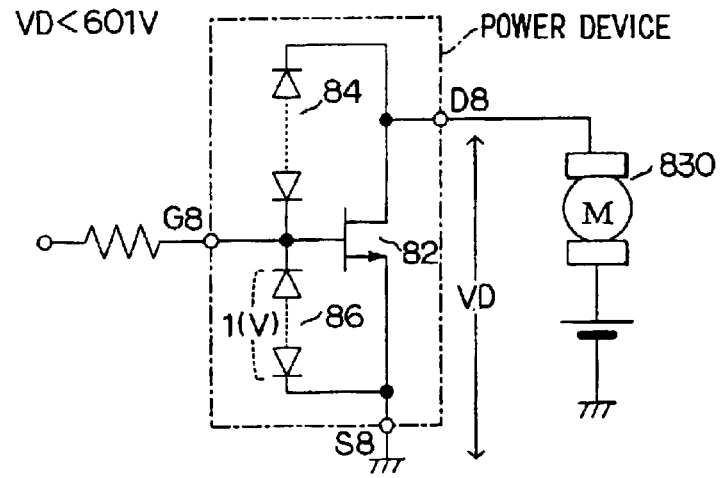
FIGS. 40A to 40C are views showing how to protect a JFET of the power device in FIG. 38 against surge energy applied to a drain terminal.
Figure 40B:
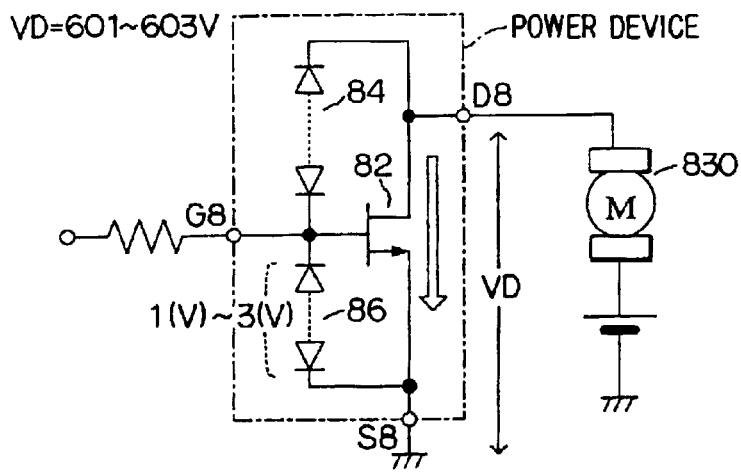

In FIG. 40A, in which the third protective diode 88 is not illustrated, the voltage VD applied to a drain terminal D8, which is electrically connected to the drain electrode 810a, by surge energy is divided between the first protective diode 84 and the second protective diode 86, so when the voltage VD applied to the drain terminal D8 is lower than 601V, the voltage applied to the second protective diode 86 is lower than 1V and the JFET 82 is not turned on because the voltage applied between the gate terminal G8 and the source terminal S8 of the JFET 82 is lower than the threshold voltage Vt (1V). As shown in FIG. 40B, in which the third protective diode 88 is not illustrated, when the voltage VD applied to the drain terminal D8 is 601V to 603V, the voltage applied to the second protective diode 86 is equal to or higher than the threshold voltage Vt (1V), so the JFET 82 is turned on, and the surge energy is released from the drain terminal D8 to the source terminal S8, which is grounded.

Figure 40C:
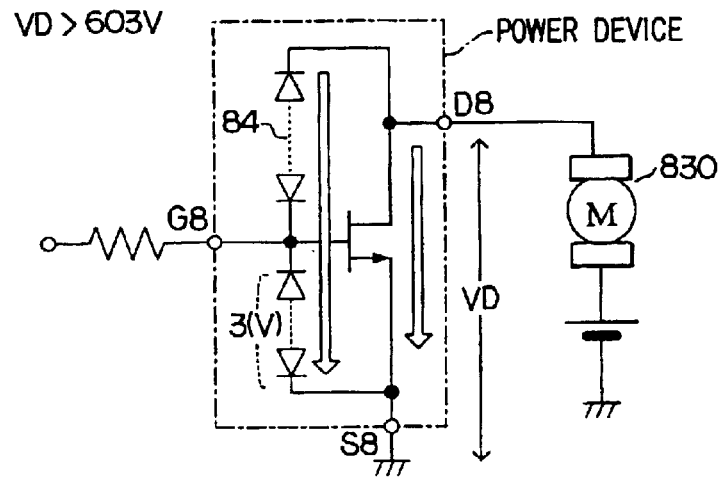

As shown in FIG. 40C, in which the third protective diode 88 is not illustrated, when the voltage VD applied to the drain terminal D8 is higher than 603V, the first and second protective diodes 84, 86 operate to prevent the voltage VD applied to the drain terminal D8 from increasing because the surge energy is released from the drain terminal D8 to the source terminal S8, which is grounded, through the first and second protective diode 84, 86. At that time, the voltage applied to the second protective diode 86 is clamped to the breakdown voltage VZ2 (3V) of the second protective diode 86 and becomes higher than the threshold voltage Vt (1V), so the JFET 82 is turned on, and the surge energy is also released from the drain terminal D8 to the source terminal S8. As described above, the breakdown voltage VZ2 (3V) of the second protective diode 86 is lower than the built-in potential Vbi (3.1V), so the voltage applied to the second protective diode 86 is lower than the built-in potential Vbi (3.1V), and a minority carrier is prevented from being injected from the p$^+$-type second JFET impurity layer 820 to the n$^-$-type drift layer 812.

Figure 41A:
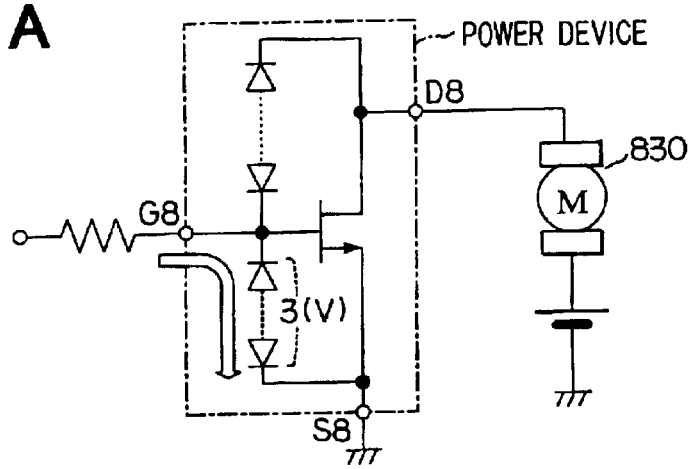
FIG. 41A is a view showing how to protect the JFET of the power device in FIG. 38 against surge energy applied to a gate terminal.

As shown in FIG. 41A, in which the third protective diode 88 is not illustrated, when the voltage due to surge energy is applied to the gate terminal G8, the surge energy is released from the gate terminal G8 to the source terminal S8 through the second protective diode 86 because the voltage due to surge energy is higher than the breakdown voltage VZ2 of the second protective diode 86.

Figure 41B:
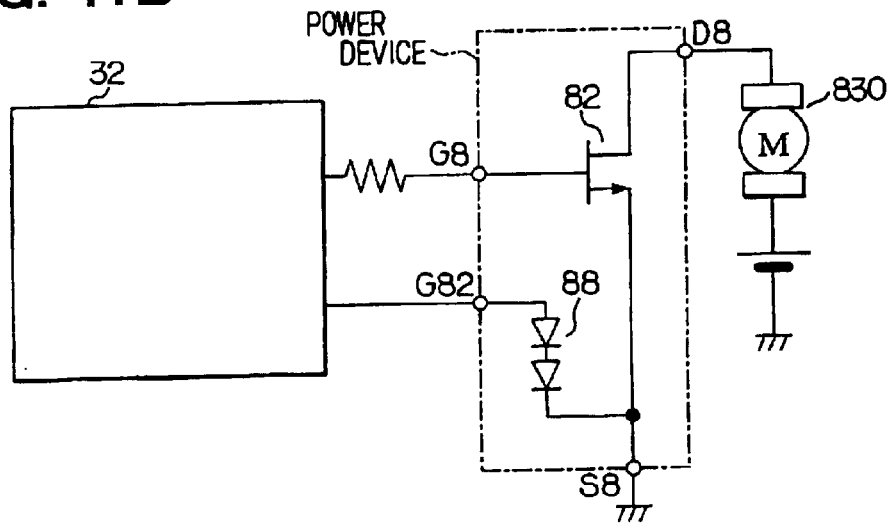
FIG. 41B is a schematic circuit diagram of a motor control system including the power device in FIG. 38 and an overheat protection circuit.

The silicon carbide power device in FIG. 38 may be used in an electric system such as a motor control system shown in FIG. 41B, which includes an overheat protection circuit 32. In FIG. 41B, the first and second protective diodes 84, 86 are not illustrated. In the motor control system, the temperature of the JFET 82 is monitored using the third protective diode 88 to prevent the JFET 82 from being destroyed due to overheat.

Specifically, the overheat protection circuit 32 including a microprocessor permits a predetermined constant current to flow through the third protective diode 88 and, at the same time, monitors the voltage Vf applied to the third protective diode 88. The current-voltage characteristics of the third protective diode 88 depend on temperature, and the voltage Vf decreases with temperature increase. The overheat protection circuit 32 calculates the temperature of the third protective diode 88, i.e., the temperature of the JFET 82, from the voltage Vf using the correlation between the voltage Vf and temperature, which is experimentally established in advance. When the calculated temperature is higher than a predetermined one, the overheat protection circuit 32 turns off the JFET 82 by adjusting the voltage applied to the gate terminal G8 to prevent the JFET 82 from overheating.

As described above, the silicon carbide power device in FIG. 38 includes the JFET 82 and the three diodes 84, 86, 88 to prevent the JFET 82 from being destroyed by an excessive energy due to static electricity or surge energy, or by overheat. In addition, the first and second protective diodes 84, 86 are integrated with the JFET 82, so the silicon carbide power device in FIG. 38 can be manufactured at lower costs and can become more compact than in the case that protective diodes of this type are provided separately from the JFET 82.

Moreover, the silicon carbide power device in FIG. 38 includes the JTE member, so when surge energy due to counter electromotive force is applied to the drain terminal, breakdown can also occur at the PN junction of the JTE member, which is formed with the n$^-$-type drift layer 812 at the periphery and the p$^-$-type region 823, which is located in the surface of the n$^-$-type drift layer 812. Therefore, the JTE member contributes to protect the p$^+$-type first and second JFET impurity layers 814, 820, which function as the gate of the JFET 82, and the circuit electrically connected to the p$^+$-type first and second JFET impurity layers 814, 820 against excessive current such as surge current applied to the device.

The first protective diode 84 is located above the JTE member, so the first protective diode 84 also contributes to prevent the electric field from intensifying locally in the JTE member by helping to distribute homogeneously the electric field. The three diodes 84, 86, 88 are located on the LTO film 822, which is an insulating oxide film, so electric charge transfer is prevented between any one of the three diodes 84, 86, 88 and the JFET 82, and the operation of the JFET is relatively stable. The silicon carbide power device in FIG. 38 includes the EQR, which has the same potential as the drift layer 812, at the periphery of the device. One end (first end) of the first protective diode 84 is electrically connected to the EQR, and the other end (second end) is electrically connected to the gate terminal G8. Therefore, so-called field plate effect helps to prevent the electric field from intensifying at the periphery.

In addition, the first protective diode 84 is located at the periphery of the device, so the device can be downsized without sacrificing the effective area of the JFET 82. The p$^+$-type first JFET impurity layer 814 is located between the first n$^+$-type source layer 816, which is electrically connected to the third protective diode 88, and the n$^-$-type drift layer 812, and the first n$^+$-type source layer 816 and the n$^-$-type drift layer 812 are electrically separated from each other using PN junctions, which is formed with the above three layers. Therefore, the JFET 82 operates without being affected by the temperature measuring operation of the third protective diode 88.

Figure 42:
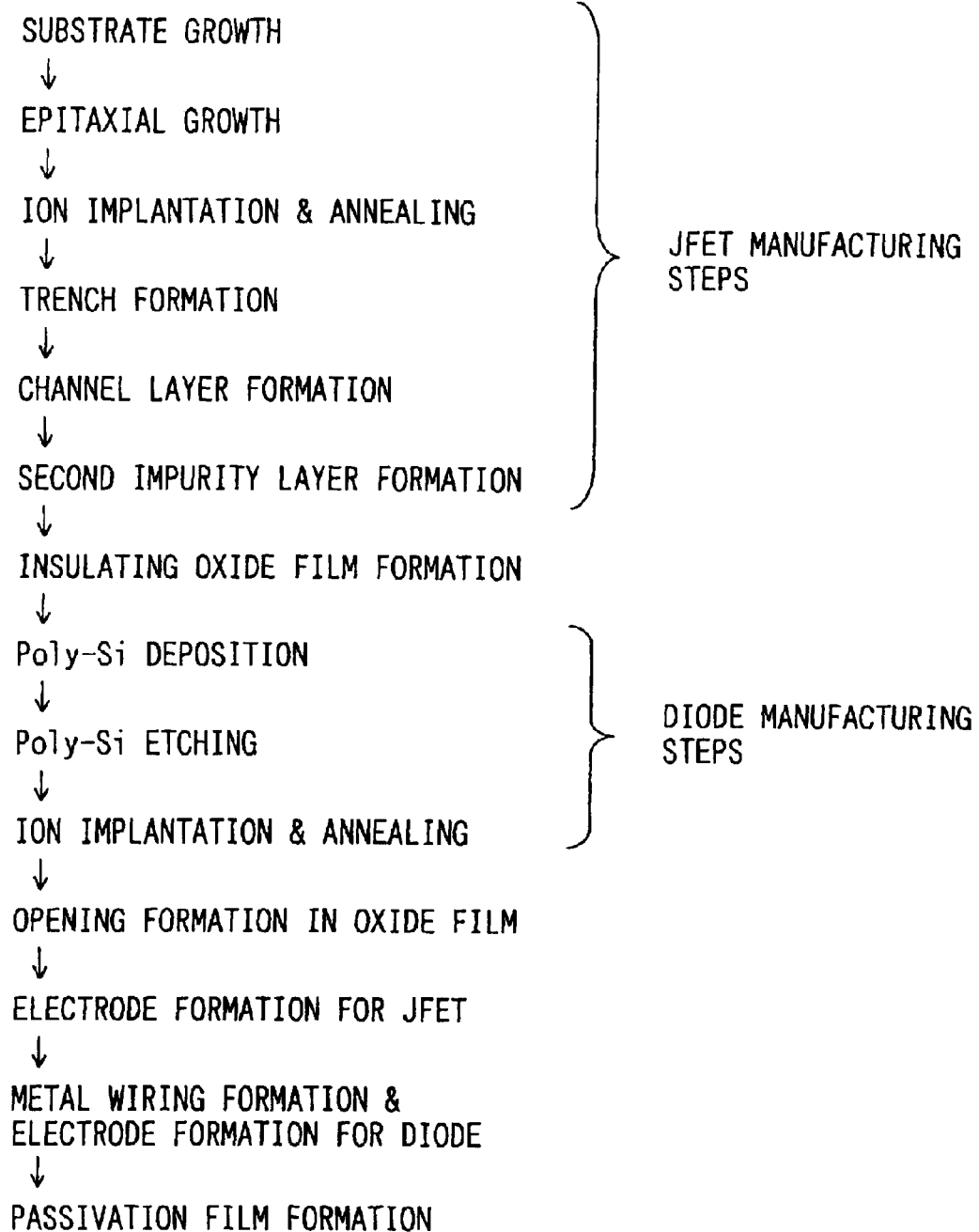
FIG. 42 is the schematic manufacturing process flow for the power device in FIG. 38.
Figure 43A:
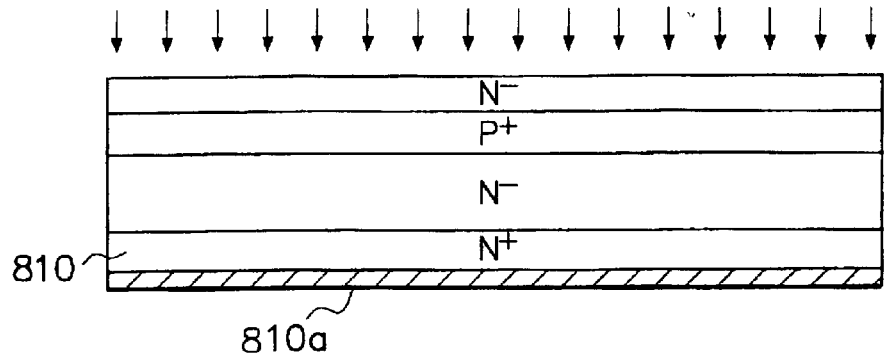
FIGS. 43a to 43D are schematic partial cross-sectional views showing sequentially manufacturing steps of the power device in FIG. 38.
Figure 43B:
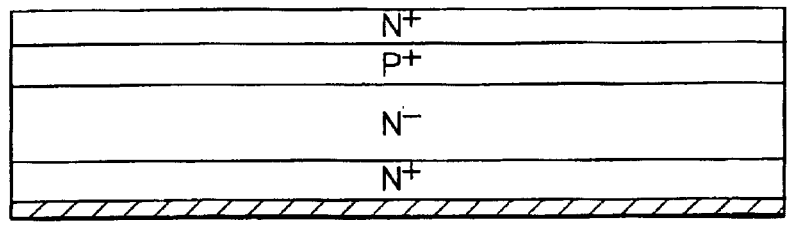

The silicon carbide power device according to the sixth embodiment is manufactured according to the process flow shown in FIG. 42, as follows. Firstly, after growing up the n$^+$-type substrate 810, an n$^-$-type first epitaxial layer, which has higher resistance than the substrate 810 and from which the n$^-$-type drift layer 812 is formed, and a p$^+$-type second epitaxial layer, from which the p$^+$-type first JFET impurity layer 814 is formed, is formed in this order on the front surface of the substrate 810. Then, as shown in FIG. 43A, an n-type third epitaxial layer is formed. As shown in FIGS. 43A and 43B, an n$^+$-type third epitaxial layer, from which the first n$^+$-type source layer 816 and the second n$^+$-type source layer 828 are formed, is formed by implanting n-type impurity ions into the n$^-$-type third epitaxial layer and annealing the ion-implanted third epitaxial layer at about 1600° C. to activate the implanted ions.

Figure 43C:
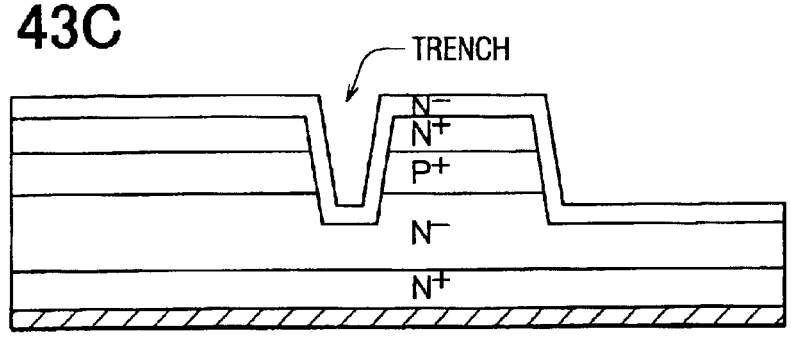
Figure 43D:
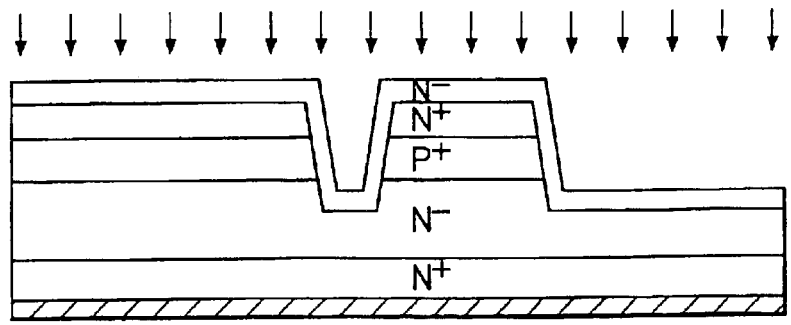
Figure 44A:
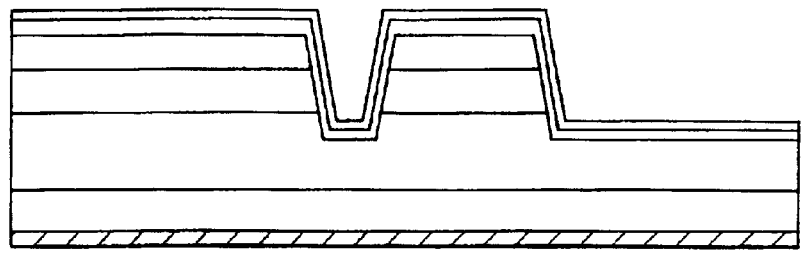
FIGS. 44a to 44D are schematic partial cross-sectional views showing sequentially manufacturing steps following the step shown in FIG. 43D.

Then, as shown in FIG. 43C, a trench, which extends from the upper surface of the n$^+$-type third epitaxial layer to the n$^-$-type first epitaxial layer through the p$^+$-type second epitaxial layer, is formed, and at the same time, a recess having the same depth is formed separately from the trench. Next, as shown in FIG. 43C, an n$^-$-type layer is formed by epitaxial growth at about 1600° C. at least on the surface defining the trench and on the n$^+$-type source layer 4 adjacent to the trench. Then, as shown in FIGS. 43D and 44A, p-type impurity ions are doped in the n$^-$-type layer using ion implantation. By annealing the doped region of the n$^-$-type layer at about 1600° C., the conduction type of the doped region is inverted, and an n$^-$-type layer and a p$^+$-type layer, from which the n$^-$-type channel layer 818 and the p$^+$-type second JFET impurity layer 820 are respectively formed, are formed in the trench. Other than ion implantation, epitaxial growth may be used to form the p$^+$-type layer.

Figure 44B:
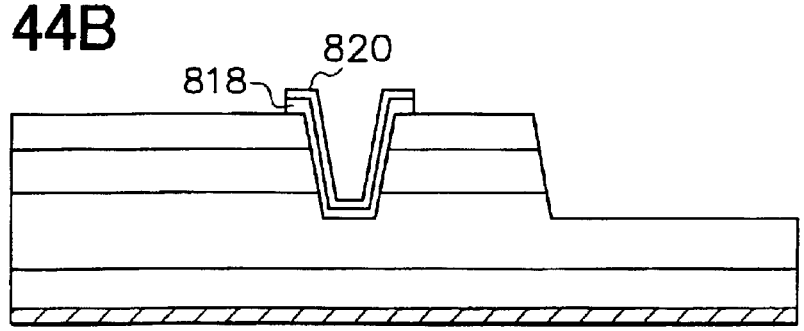
Figure 44C:
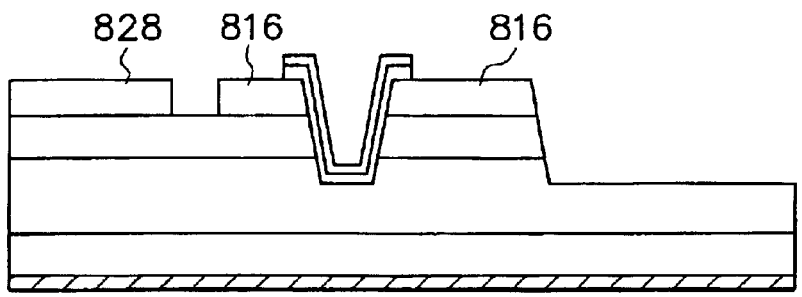
Figure 44D:
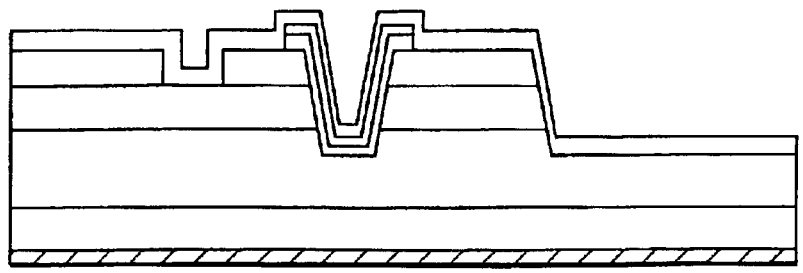

Subsequently, as shown in FIG. 44B, the n$^-$-type channel layer 818 and the p$^+$-type second JFET impurity layer 820 are formed by selectively etching the p$^+$-type layer and the n$^-$-type layer located under the p$^+$-type layer. Then, as shown in FIG. 44C, the first n$^+$-type source layer 816 and the second n$^+$-type source layer 828 are formed by etching the n$^+$-type third epitaxial layer. Next, as shown in FIG. 44D, an insulating oxide film is deposited by low temperature CVD to form the LTO film 822.

Figure 45A:
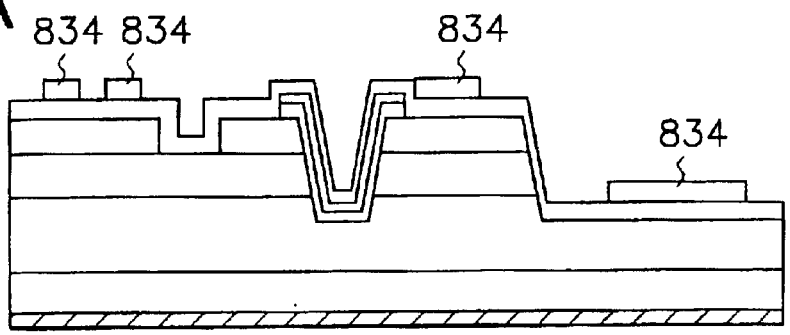
FIGS. 45a to 45D are schematic partial cross-sectional views showing sequentially manufacturing steps following the step shown in FIG. 44D.
Figure 45B:
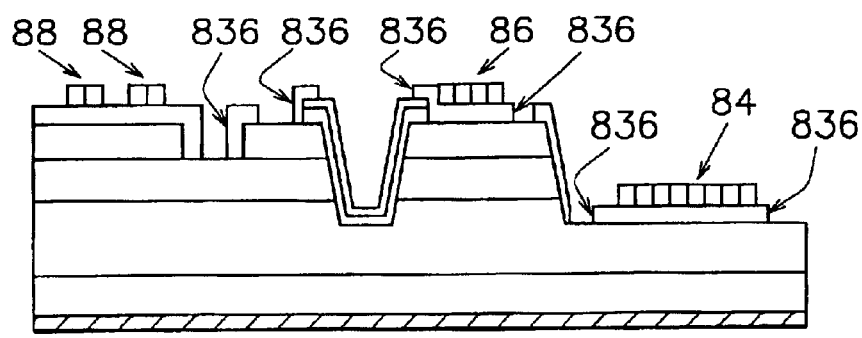

Next, as shown in FIG. 45A, non-doped polycrystalline layers 834 are formed at predetermined positions on the insulating oxide film, and each non-doped polycrystalline layer 834 is doped with p-type impurity ions and n-type impurity ions by ion implantation. By annealing the doped polycrystalline layers 834 to activate the implanted ions, the first protective diode 84, the second protective diode 86, and the third protective diode 88 are formed, as shown in FIG. 45B. The openings 836 are formed in the LTO film 822 to permit the layers covered by the LTO film 822 to electrically communicate with the outside.

Figure 45C:
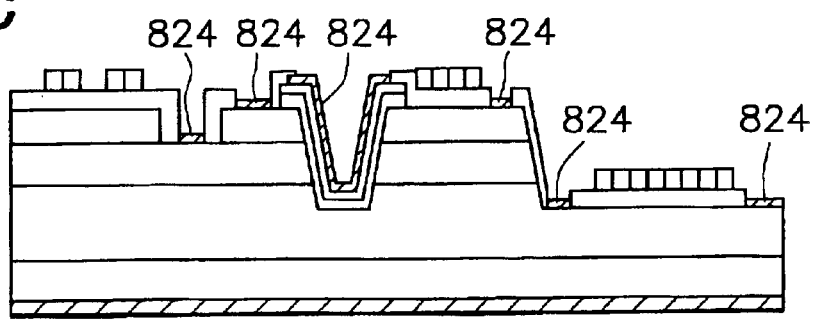
Figure 45D:
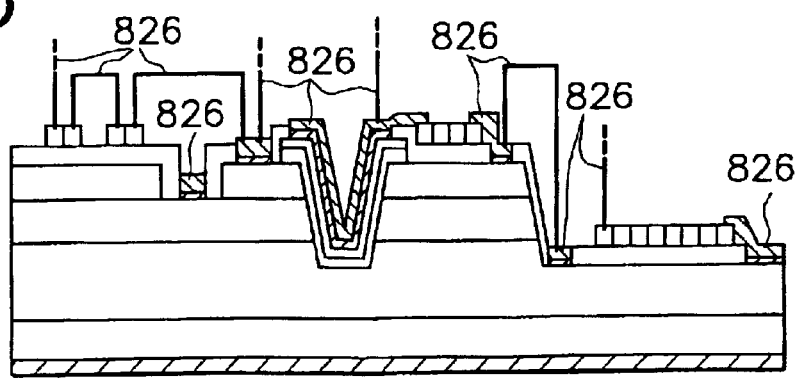

Then, as shown in FIG. 45C, the ohmic contact electrodes 824 are formed at about 1000° C. in the openings. As shown in FIG. 45D, by forming the aluminum wires 826, other ohmic contact electrodes for the first protective diode 84, the second protective diode 86, and the third protective diode 88 are formed, and at the same time, each wiring electrode, which is a part of one of the aluminum wires 826, is formed on each ohmic contact electrode 824 in each opening. Finally, although not illustrated, a passivation film is formed to protect the JFET 82 and the diodes 84, 86, 88 against contamination.

As described above, in the manufacturing process of the silicon carbide power device in FIG. 38, the diodes 84, 86, 88, which are substantially made of polycrystalline silicon, are formed after steps having relatively high temperature treatment to form the JFET 82 such as annealing for activating implanted ions and epitaxtial growth, so problems such as sublimation of silicon from the diodes 84, 86, 88 and undesired outward diffusion of the implanted ions in the diodes 84, 86, 88 are avoidable.

In addition, in the above manufacturing process, ohmic contact electrodes for the diodes 84, 86, 88 are formed after the step of forming the ohmic contact electrodes 824, so a problem that the material of the ohmic contact electrodes for the diodes 84, 86, 88 undesirably diffuses into the diodes 84, 86, 88. Moreover, in the above manufacturing process, the formation of the ohmic contact electrodes for the protective diodes 84, 86, 88 and the electric connection between the ohmic contact electrodes for the protective diodes 84, 86, 88 and the ohmic contact electrodes 824 are simultaneously achieved by forming the aluminum wires 826. Therefore, the manufacturing process is relatively simple.

Seventh Embodiment

Figure 46:
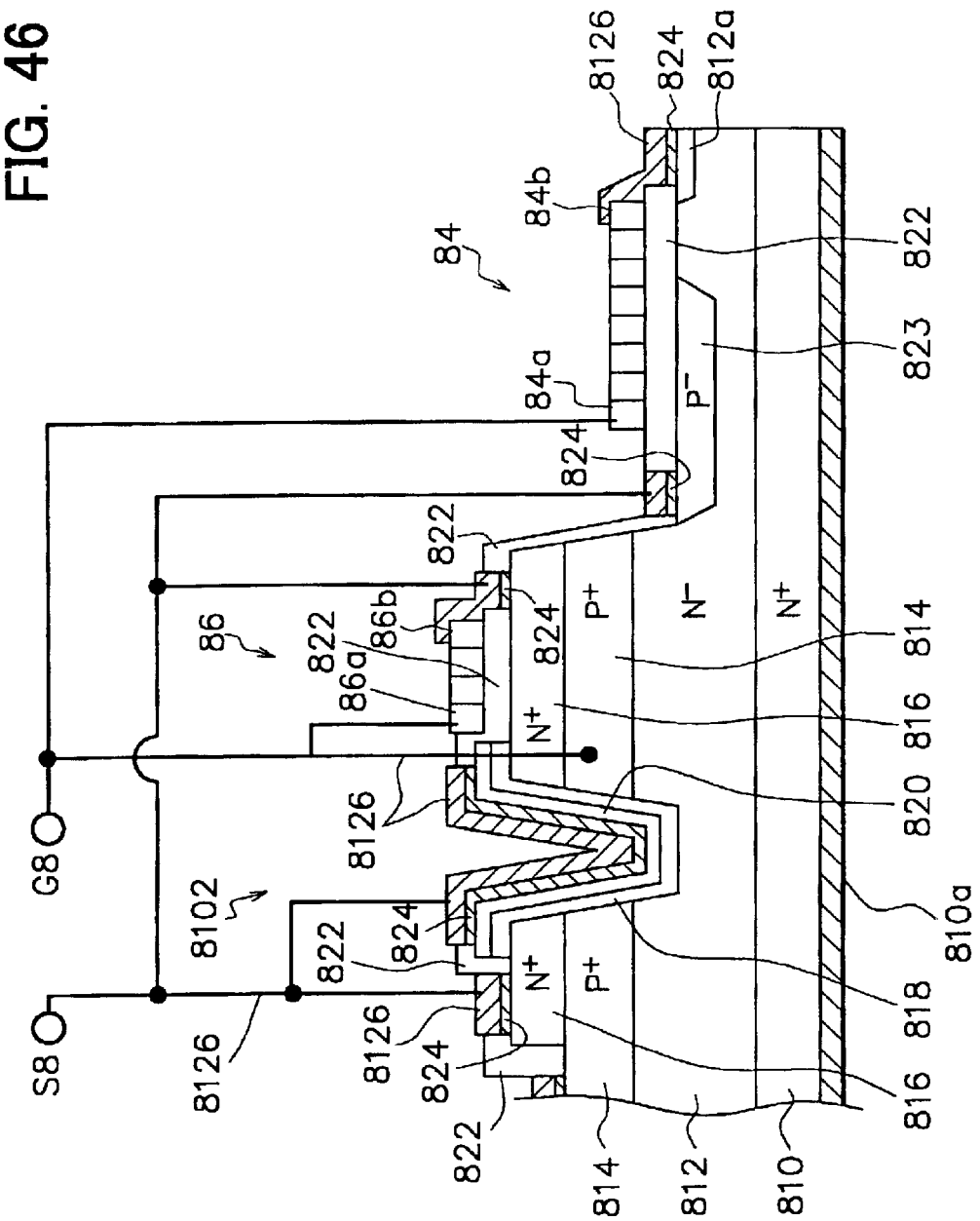
FIG. 46 is a view showing a schematic partial cross-sectional structure and a schematic wiring diagram of a silicon carbide power device according to a seventh embodiment of the present invention.

As shown in FIG. 46, in which the third protective diode 88 is not illustrated, a silicon carbide power device according to the seventh embodiment is different in aluminum wiring pattern from the silicon carbide power device in FIG. 38. Specifically, the silicon carbide power device in FIG. 46 includes a JFET 8102 as a silicon carbide power transistor and aluminum wires 8126. In the silicon carbide power device in FIG. 46, the $p^+$-type first JFET impurity layer 814 of the JFET 8102 is electrically connected to the gate terminal G8 by one of the aluminum wires 8126, and the $p^+$-type second JFET impurity layer 820 of the JFET 8102 is electrically connected to the source terminal S8. Other items are the same as in the device of FIG. 38, so description on the items will no be reiterated.

With the above electric connections, the device in FIG. 46 has the following effect in addition to the same effects as the device in FIG. 38. In the device in FIG. 46, the $p^+$-type first JFET impurity layer 814 is electrically connected to the gate terminal G8. Therefore, when a voltage is applied to the drain terminal D, a depletion layer extends from the $p^+$-type first JFET impurity layer 814 toward the $n^-$-type drift layer 812, and the electric field in the JFET 8102 is prevented from intensifying locally.

Moreover, in the device in FIG. 46, the bottom of the $p^+$-type second JFET impurity layer 820, which has the same potential as the first $n^+$-type source layer 816, is closer to the $n^+$-type substrate 810 than the $p^+$-type first JFET impurity layer 814, which functions as the gate of the JFET 8126. Therefore, an avalanche breakdown occurs at the PN junction between the $p^+$-type second JFET impurity layer 820 and the $n^-$-type channel layer 818 at a lower voltage than the voltage at which an avalanche breakdown otherwise occurs at the PN junction between the $p^+$-type first JFET impurity layer 814 and the $n^-$-type drift layer 812, so the avalanche breakdown at the PN junction between the $p^+$-type first JFET impurity layer 814 and the $n^-$-type drift layer 812 is prevented.

The current caused by the breakdown at the PN junction between the $p^+$-type first JFET impurity layer 814 and the $n^-$-type drift layer 812 is pulled down to the source terminal 8 without passing through a parasitic transistor in the JFET 8102 because the $p^+$-type second JFET impurity layer 820 is closer to the $n^+$-type substrate 810 than the $p^+$-type first JFET impurity layer 814 is. With the above structure, the JFET 8102 has the same level of resistance against surge energy as a PN diode, and the gate of the JFET 8102, which is the $p^+$-type first JFET impurity layer 814, and the circuit that controls the gate are prevented from being destroyed even if the breakdown occurs at the gate.

Eighth Embodiment

Figure 47:
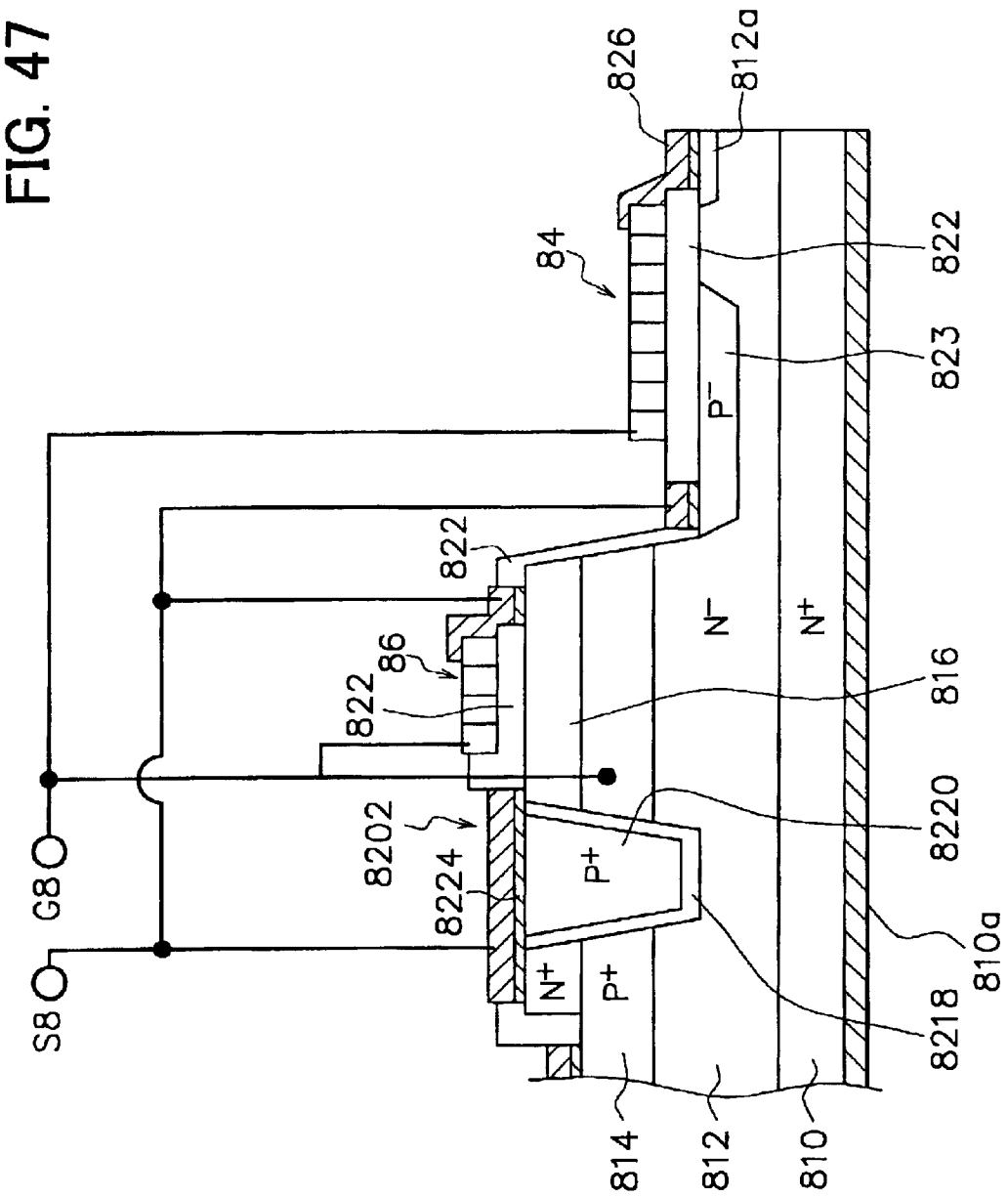
FIG. 47 is a view showing a schematic partial cross-sectional structure and a schematic wiring diagram of a silicon carbide power device according to an eighth embodiment of the present invention.

As shown in FIG. 47, in which the third protective diode 88 is not illustrated, a silicon carbide power device according to the eighth embodiment includes a JFET 8202 as a silicon carbide power transistor. In the JFET 8202, an $n^-$-type channel layer 8218, which is substantially made of SiC, is located on the surface defining a trench, and the rest of the trench is filled with a $p^+$-type second JFET impurity layer 8220, which are substantially made of SiC. As viewed in FIG. 47, the upper surface of the $p^+$-type second JFET impurity layer 8220 is substantially on the same level as the upper surface of the first $n^+$-type source layer 816, and the $p^+$-type second JFET impurity layer 8220 and the first $n^+$-type source layer 816 are electrically connected together by a substantially flat ohmic contact electrode 8224. The device in FIG. 47 is different in the structure described above from the device in FIG. 46. Other items are the same, so description on the items will no be reiterated.

Figure 48:
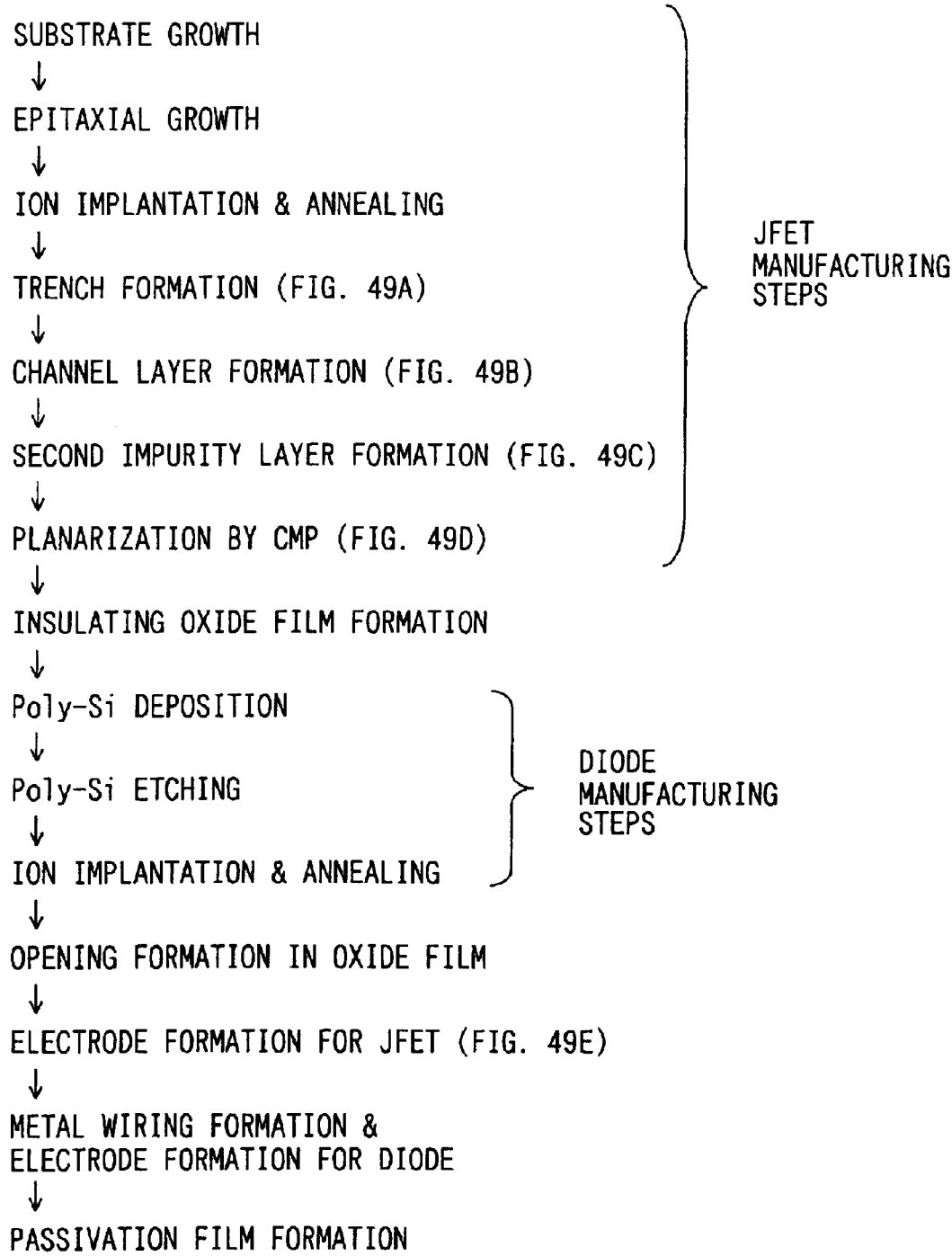
FIG. 48 is the schematic manufacturing process flow for the power device in FIG. 47.
Figure 49A:
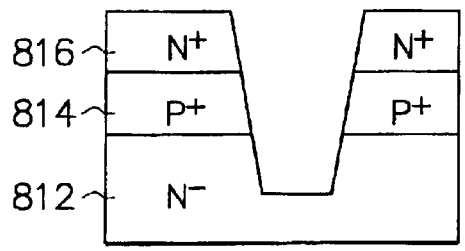
FIGS. 49A to 49E are schematic partial cross-sectional views showing sequentially manufacturing steps of the power device in FIG. 47.
Figure 49D:
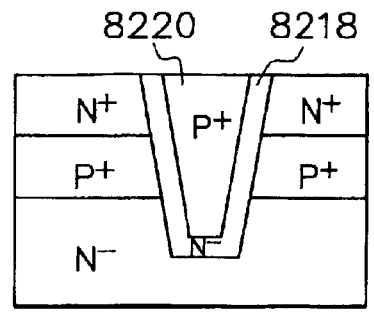
Figure 49B:
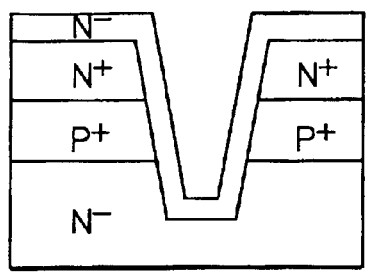

The silicon carbide power device in FIG. 47 having the above structure is manufactured according to the process flow shown in FIG. 48. After an intermediate device shown in FIG. 43B is formed using the same steps as described in the manufacturing process of the silicon carbide power device in FIG. 38, the trench, which extend from the upper surface of the $n^+$-type third epitaxial layer to the $n^-$-type first epitaxial layer through the $p^+$-type second epitaxial layer, is formed as shown in FIG. 49A. Next, as shown in FIG. 49B, an $n^-$-type layer (fourth epitaxial layer), from which the $n^-$-type channel layer 8218 is formed, is formed by epitaxial growth at least on the surface defining the trench.

Figure 49E:
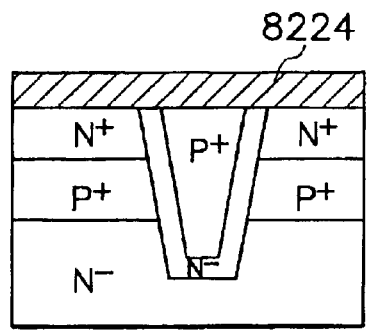
Figure 49C:
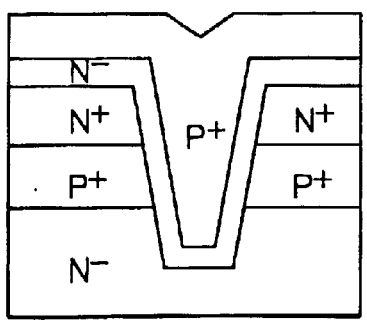

Then, as shown in FIG. 49C, a $p^+$-type layer (fifth epitaxial layer), from which the $p^+$-type second JFET impurity layer 8220 is formed, is formed by epitaxial growth such that the rest of the trench is filled with the $p^+$-type layer. As shown in FIG. 49D, the $n^-$-type layer and the $p^+$-type layer are planarized using CMP to the level defined by the upper surface of the $n^+$-type third epitaxial layer to form the n⁻-type channel layer 8218 and the p⁺-type second JFET impurity layer 8220 such that the upper surface of the n⁺-type third epitaxial layer is exposed and the upper surface of the p⁺-type second JFET impurity layer 8220 is substantially on the same level as the upper surface of the n⁺-type third epitaxial layer.

Then, as shown in FIG. 48, the step of forming an insulating oxide film to the step of forming openings in the oxide film are implemented as described in the manufacturing process of the device in FIG. 38. Subsequently, as shown in FIG. 49E, the substantially flat ohmic contact electrode 8224, by which the p⁺-type second JFET impurity layer 8220 and the first n⁺-type source layer 816 are electrically connected together, is formed.

Figure 50:
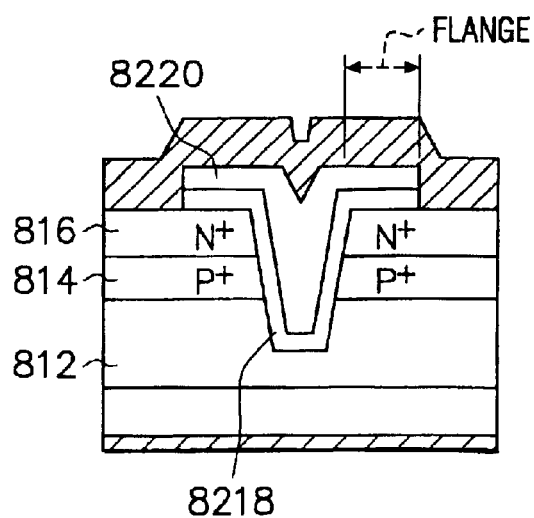
FIG. 50 is a schematic partial cross-sectional view of a reference structure for the power device in FIG. 47.

In the device in FIG. 38 and device in FIG. 46, or in the case that the n⁻-type layer and the p⁺-type layer are not planarized using CMP, a flange, which includes a part of the n⁻-type channel layer 8218 and the p⁺-type second JFET impurity layer 8220, is formed around the trench, as shown by the reference structure in FIG. 50, and the JFETs in the devices become larger. On the other hand, the JFET 8202 of the silicon carbide power device in FIG. 47 has no flange, so the JFET 8202 can be more compact than those of the device in FIG. 38 and the device in FIG. 46.

Ninth Embodiment

Figure 51:
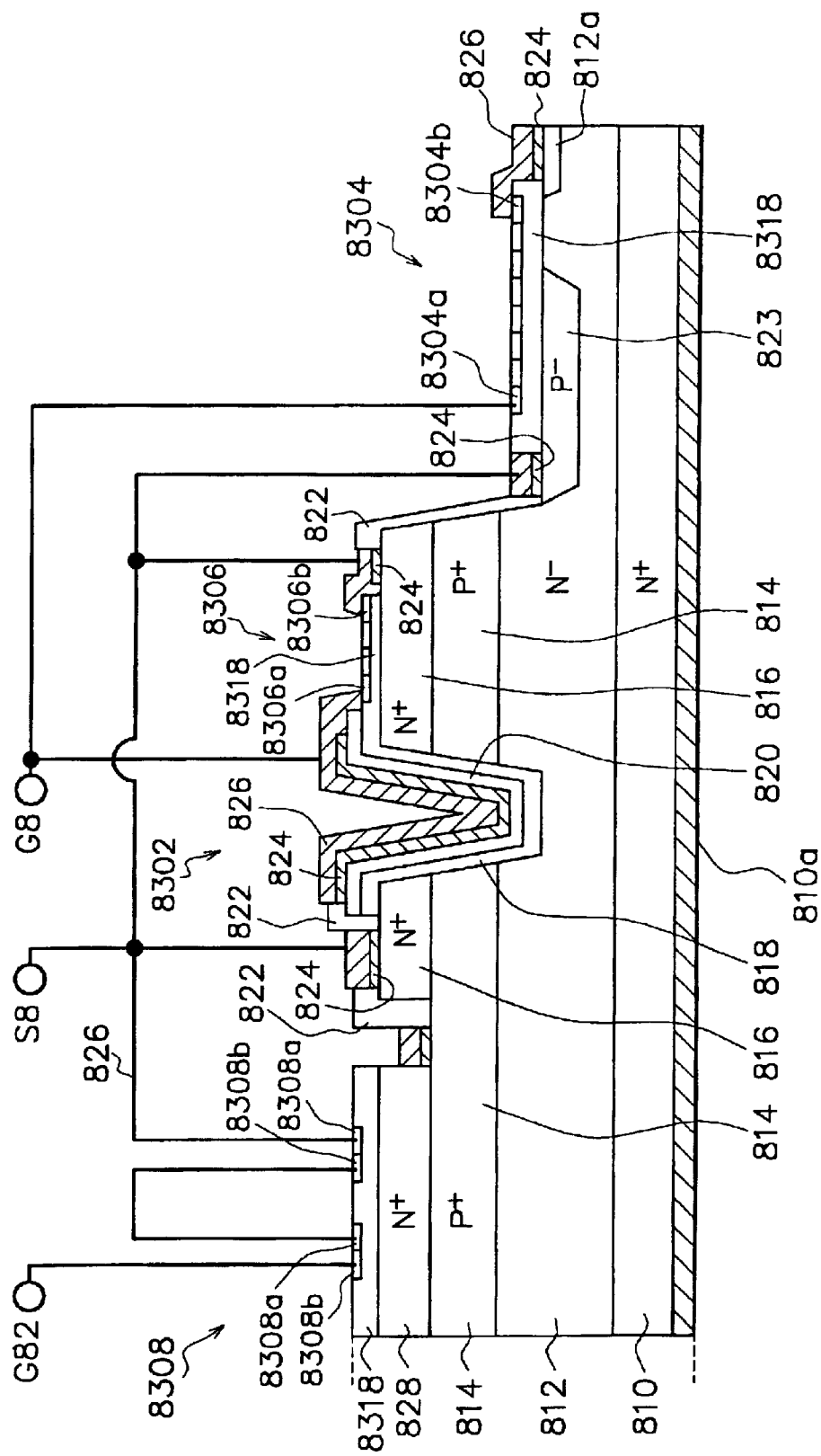
FIG. 51 is a view showing a schematic partial cross-sectional structure and a schematic wiring diagram of a silicon carbide power device according to a ninth embodiment of the present invention.

As shown in FIG. 51, a silicon carbide power device according to the ninth embodiment includes a JFET 8302 as a silicon carbide power transistor, a first protective diode 8304, a second protective diode 8306, and a third protective diode 8308. The diodes 8304, 8306, 8308 are substantially made of SiC in stead of polycrystalline silicon. In this aspect, the silicon carbide power device in FIG. 51 is different from the silicon carbide power device in FIG. 38. Other items are the same, so description on the items will no be reiterated.

The diodes 8304, 8306, 8308 are located in an n⁻-type layer 8318. The diodes 8304, 8306, 8308 are formed by implanting n-type impurity ions and p-type impurity ions into the n⁻-type layer 8318. Although not illustrated, the n⁻-type layer 8318 includes an insulating layer, which is formed by implanting vanadium ions into an n⁻-type layer, and with which the first protective diode 8304, the second protective diode 8306, and the third protective diode 8308 are respectively insulated from the JTE member, the first n⁺-type source layer 816, and the second n⁺-type source layer 828.

Figure 52:
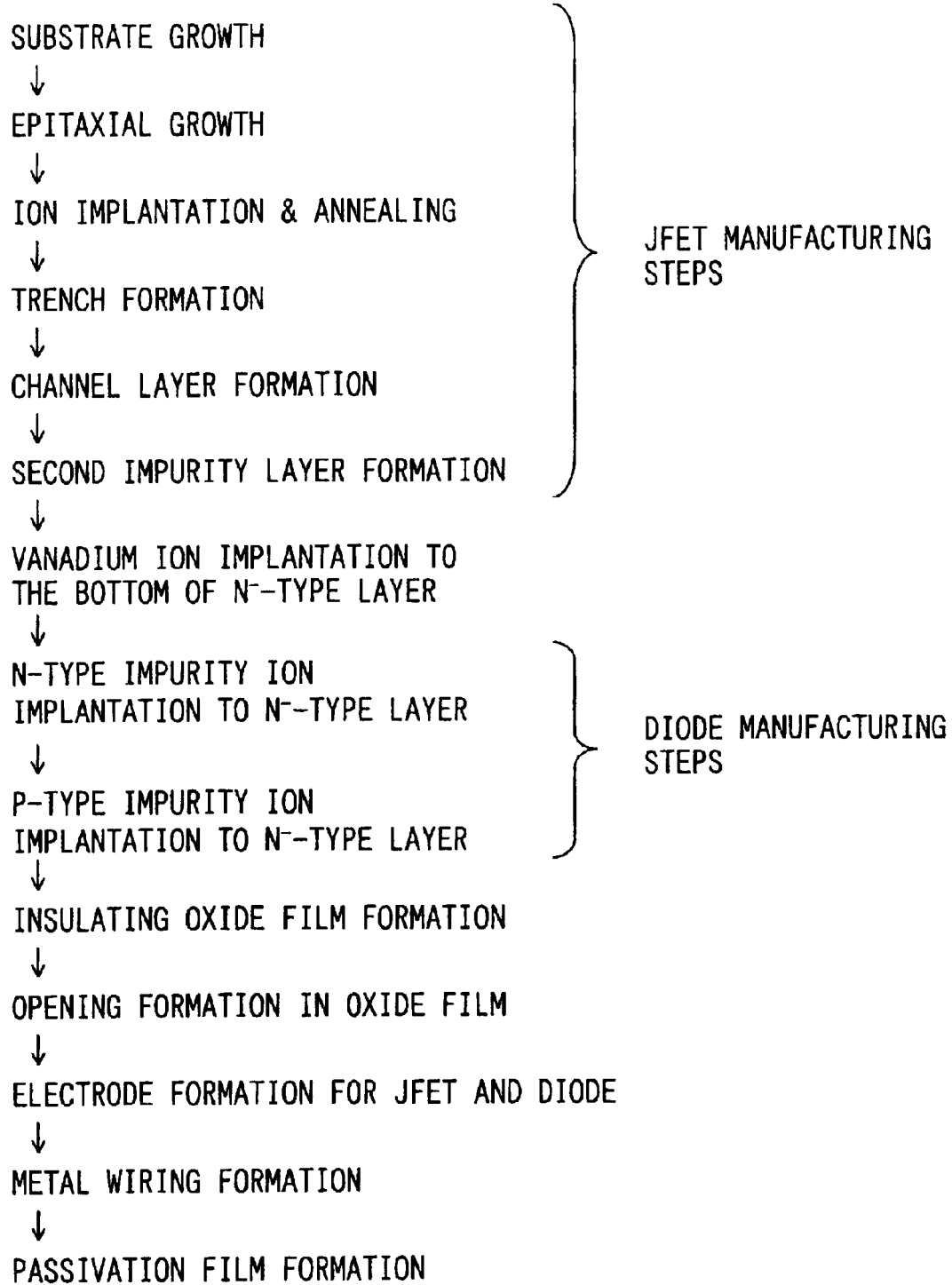
FIG. 52 is the schematic manufacturing process flow for the power device in FIG. 51.

The silicon carbide power device in FIG. 51 is manufactured according to the process flow shown in FIG. 52. After the steps of forming the trench, an n⁻-type layer, from which the n⁻-type channel layer 818, the p⁺-type second JFET impurity layer 820, and the n⁻-type layer 8318 are formed, is formed by epitaxial growth. Then, the n⁻-type channel layer 818 and the p⁺-type second JFET impurity layer 820 are formed, and vanadium ions are implanted at predetermined positions into the n⁻-type layer, which is formed by epitaxial growth, to form the insulating layer of the n⁻-type layer 8318. Then, n-type impurity ions and p-type impurity ions are implanted into the n⁻-type layer, which is implanted with vanadium ions, to form the diodes 8304, 8306, 8308 on the insulating layer.

Then, the step of forming the insulating oxide film to the step of forming the passivation film are implemented in the same manner as described in the manufacturing process of the device in FIG. 38. In the step of forming the ohmic contact electrodes 824 for the JFET 8302, although not illustrated, ohmic contact electrodes for the diodes 8304, 8306, 8308 are formed in addition to the ohmic contact electrodes 824. In the step of forming the aluminum wires 826, the ohmic contact electrodes for the diodes 8304, 8306, 8308 and the ohmic contact electrodes 824 for the JFET 8302 are electrically connected together by the aluminum wires 826.

The device in FIG. 51 has the following effect in addition to the same effects as the device in FIG. 38. The diodes 8304, 8306, 8308 are substantially made of SiC which is more resistive against temperature than polycrystalline silicon, so the JFET 8302 of the device in FIG. 51 is preferably protected by the diodes 8304, 8306, 8308 even at a relatively high temperature.

The insulating layer, which is located in the n⁻-type layer 8318 to insulate the diodes 8304, 8306, 8308 from the JTE member and the first and second n⁺-type source layer 816 828, may be omitted. In that case, the n⁻-type layer 8318 located between the first protective diode 8304 and the JTE member becomes a conductive layer, so the first protective diode 8304 further contributes to prevent the electric field from intensifying locally in the JTE member.

The present invention is not limited to the above embodiments, and may be modified further within the spirit of the invention.

What is claimed is:

1. A silicon carbide power device comprising:
   a silicon carbide power transistor including a normally-off junction field effect transistor, both gates of which are voltage controlled;
   a protective diode, which prevents the silicon carbide power transistor from being destroyed and protects a circuit that controls a gate of the transistor;
   a substrate, which is substantially made of SiC and has a first conduction type;
   a drift layer, which is substantially made of SiC and has the first conduction type;
   a first JFET impurity layer, which is substantially made of SiC and has a second conduction type; and
   a source layer, which is substantially made of SiC and has the first conduction type, wherein the drift layer has an impurity concentration lower than those of the substrate and the source layer, wherein the drift layer, the first JFET impurity layer, and the source layer are sequentially layered in this order on a surface of the substrate, and wherein the junction field effect transistor includes:
   a part of the substrate;
   a part of the drift layer;
   a part of the first JFET impurity layer;
   a part of the source layer, wherein a trench extends from a surface of the part of the source layer to the part of the drift layer through the part of the first JFET impurity layer;
   a channel layer, which is substantially made of SiC, has the first conduction type, and is located on a surface defining the trench; and
   a second JFET impurity layer, which is substantially made of SiC, has the second conduction type, and located on the channel layer.

2. The device in claim 1, wherein the first JFET impurity layer and the second JFET impurity layer make up a gate of the transistor.

3. The device in claim 1, wherein the first JFET impurity layer makes up a gate of the device, and the second JFET impurity layer is electrically connected to the source layer and is closer to the substrate than the first JFET impurity layer.

4. The device in claim 1, wherein the protective diode is a Zener or PN junction diode, which has a PN junction and an electrode of the protective diode is grounded.

5. The device in claim 4, wherein the PN junction of the protective diode has a breakdown voltage lower than that of a PN junction formed with the first JFET impurity layer and the drift layer in the transistor.

6. The device in claim 1, wherein the protective diode is a Schottky diode and an electrode of the protective diode is grounded.

7. The device in claim 6, wherein a Schottky junction of the Schottky diode has a breakdown voltage lower than that of a PN junction formed with the first JFET impurity layer and the drift layer in the transistor.

8. The device in claim 7, wherein the Schottky diode includes an electrode that substantially determines the breakdown voltage of the diode using a Schottky barrier height.

9. The device in claim 7, wherein the Schottky diode includes a part of the substrate and a part of the drift layer, wherein the breakdown voltage of the diode is determined by the distance between the boundary of the Schottky junction and the boundary between the part of the drift layer and the part of the substrate.

10. The device in claim 1, wherein the protective diode accounts for 10 to 50 % of the entire area of the device.

11. The device in claim 4, wherein the protective diode includes:
a part of the substrate;
a part of the drift layer, wherein a trench extends from a surface of a part of the source layer to the part of the drift layer through a part of the first JFET impurity layer;
an impurity layer, which is substantially made of SiC, has the second conduction type, and located on a surface defining the trench of the protective diode; and
an electrode, which is located on the impurity layer and is grounded, wherein the impurity layer of the protective diode is closer to the substrate than the second JFET impurity layer in the transistor is.

12. The device in claim 4, wherein the protective diode includes:
a part of the substrate;
a part of the drift layer, wherein a trench, the depth of which is substantially equal to that of the trench in the transistor, extends from a surface of a part of the source layer to the part of the drift layer through a part of the first JFET impurity layer;
a first diode impurity layer, which is substantially made of SiC, has the first conduction type, and located on a surface defining the trench of the protective diode;
a second diode impurity layer, which is substantially made of SiC, has the second conduction type, and located on the first diode impurity layer; and
an electrode, which is located on the second diode impurity layer and is grounded, wherein the second diode impurity layer of the protective diode is closer to the substrate than the second JFET impurity layer in the transistor.

13. The device in claim 4, wherein the protective diode includes:
a part of the substrate;
a part of the drift layer;
a region, which is substantially made of SiC, has the second conduction type, and is located in a surface of the drift layer;
a part of the first JFET impurity layer; and
an electrode, which is in ohmic contact with the part of the first JFET impurity layer and is grounded, wherein the region is closer to the substrate than the second JFET impurity layer in the transistor is.

14. The device in claim 4, wherein the protective diode includes:
a part of the substrate;
a part of the drift layer, wherein a trench deeper than the trench in the transistor extends from a surface of a part of the source layer to the part of the drift layer through a part of the first JFET impurity layer;
a first diode impurity layer, which is substantially made of SiC, has the first conduction type, and located on a surface defining the trench in the protective diode;
a second diode impurity layer, which is substantially made of SiC, has the second conduction type, and located on the first impurity; and
an electrode, which is located on the second diode impurity layer and is grounded, wherein the second diode impurity layer of the protective diode is closer to the substrate than the second JFET impurity layer in the transistor is.

15. The device in claim 6, wherein the protective diode includes:
a part of the substrate;
a part of the drift layer, wherein a trench extends from a surface of a part of the source layer to the part of the drift layer through a part of the first JFET impurity layer;
an impurity layer, which is substantially made of SiC, has the first conduction type, and located on a surface defining the trench of the protective diode; and
an electrode, which is in electric contact with the impurity layer to form a Schottky junction and is grounded, wherein the protective diode has a breakdown voltage lower than that a PN junction formed with the first JFET impurity layer and the drift layer in the transistor.

16. The device in claim 1, wherein the protective diode is substantially made of polycrystalline silicon.

17. The device in claim 1, wherein the protective diode is substantially made of SiC.

18. The device in claim 1, including a JTE member at a periphery of the device, wherein the protective diode is located above the JTE member.

19. The device in claim 18 including a conductive layer, which is located between the protective diode and the JTE member.

20. The device in claim 1, including an insulating layer, on which the protective diode is located.

* * * * *